(12) United States Patent  
Nishi et al.

(10) Patent No.: US 8,844,438 B2
(45) Date of Patent: Sep. 30, 2014

(54) SCREEN PRINTING APPARATUS AND SQUEEGEE MECHANISM

(75) Inventors: Eiichi Nishi, Tokyo (JP); Muneyoshi Numao, Saitama (JP)

(73) Assignee: Juki Automation Systems Corporation, Tokyo (JP)

(*) Notice: Subject to any disclaimer, the term of this patent is extended or adjusted under 35 U.S.C. 154(b) by 396 days.

(21) Appl. No.: 12/728,531

(22) Filed: Mar. 22, 2010

(65) Prior Publication Data

US 2010/0242754 A1  Sep. 30, 2010

(30) Foreign Application Priority Data

Mar. 31, 2009 (JP) .................. 2009-084653

(51) Int. Cl.
- B05C 17/04 (2006.01)
- B41F 15/44 (2006.01)
- B41F 15/46 (2006.01)
- B41F 15/08 (2006.01)
- H05K 3/12 (2006.01)

(52) U.S. Cl.
CPC .......... B41F 15/0818 (2013.01); *H05K 3/1216* (2013.01); B41F 15/44 (2013.01); B41F 15/46 (2013.01)
USPC ........................ 101/123; 101/124; 101/129

(58) Field of Classification Search
CPC ............. B41F 15/0818; B41F 15/0827; B41F 15/085; B41F 15/0854; B41F 15/42; B41F 15/423; B41F 15/44; B41F 15/46

USPC .................................. 101/123, 124, 126, 129
See application file for complete search history.

(56) References Cited

U.S. PATENT DOCUMENTS

| | | | | |
|---|---|---|---|---|
| 2,753,794 | A * | 7/1956 | Groak | 101/124 |
| 5,027,703 | A * | 7/1991 | Hancy | 101/123 |
| 5,685,221 | A * | 11/1997 | Newman | 101/123 |
| 5,826,516 | A * | 10/1998 | Shimazu et al. | 101/483 |
| 5,988,856 | A * | 11/1999 | Braunstein et al. | 700/160 |
| 6,335,055 | B1 * | 1/2002 | Miyahara et al. | 427/272 |
| 7,836,824 | B2 * | 11/2010 | Mizuno et al. | 101/126 |

FOREIGN PATENT DOCUMENTS

JP  2007-015307  1/2007

* cited by examiner

*Primary Examiner* — Ren Yan
(74) *Attorney, Agent, or Firm* — Dentons US LLP

(57) ABSTRACT

A screen printing apparatus includes: a main squeegee that includes a pair of end portions in a width direction and prints, by sliding in a direction orthogonal to the width direction on an upper surface of a screen that is supplied with a paste-like material and on which a hole is formed, the paste-like material on an upper surface of a printing object provided on a lower surface side of the screen via the hole; and a pair of auxiliary squeegees each including a first end portion provided more on an outer side than the end portion in the width direction and a second end portion provided more on an inner side than the end portion in the width direction, the pair of auxiliary squeegees being tilted a predetermined angle with respect to the main squeegee on a rear side of the main squeegee in the sliding direction.

9 Claims, 16 Drawing Sheets

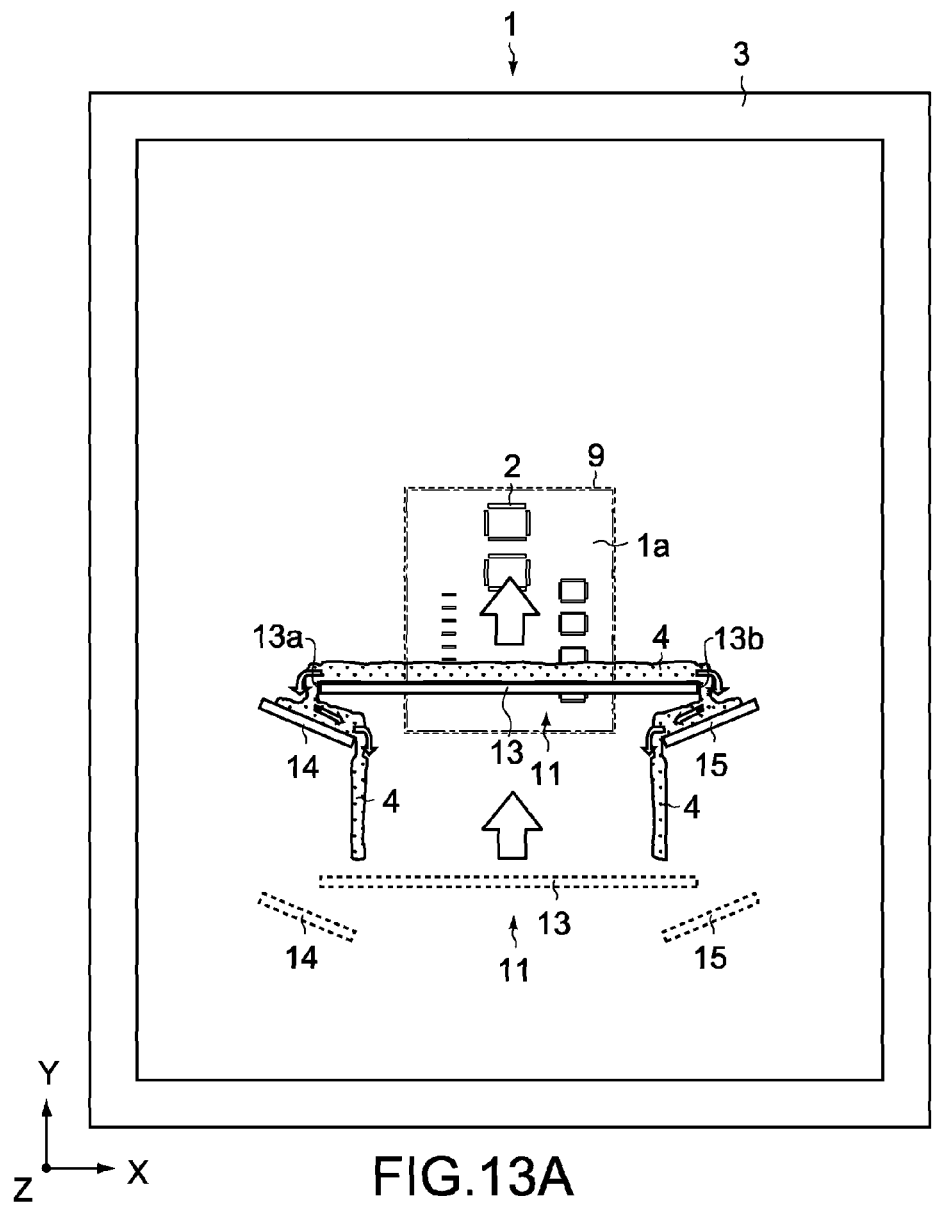
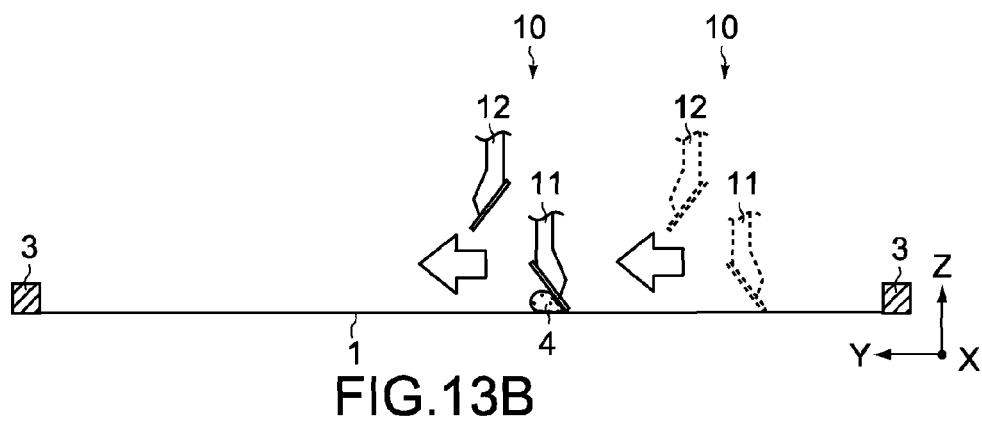
FIG.13A
FIG.13B

SCREEN PRINTING APPARATUS AND SQUEEGEE MECHANISM

BACKGROUND OF THE INVENTION

1. Field of the Invention

The present invention relates to a screen printing apparatus for printing a paste-like material such as a cream solder on a printing object such as a print substrate via a hole formed on a screen, and a squeegee mechanism used in the screen printing apparatus.

2. Description of the Related Art

From the past, a screen printing apparatus that prints a cream solder on a print substrate has been widely used.

In the screen printing apparatus, a squeegee is provided above a screen on which pattern holes are formed, and a substrate is provided below the screen. A cream solder is supplied to the screen, and the squeegee slides above the screen. When the squeegee slides above the screen, the cream solder is pressed by the squeegee and moves above the pattern holes formed on the screen. As a result, the cream solder is printed on the substrate provided below the pattern holes.

Here, there is a problem that, when the cream solder is pressed by the sliding squeegee and moves on the screen, the cream solder leaks from sides of end portions of the squeegee in a width direction.

As a technique regarding such a problem, Japanese Patent Application Laid-open No. 2007-15307 (paragraphs (0026) and (0031), FIGS. 3 to 5) discloses a squeegee head that is provided with a scraping member at both ends of a squeegee in a width direction, for example. The two scraping members are provided to the squeegee such that they extend to a front side of the squeegee while an interval therebetween is widened toward the front side. The two scraping members scrape off the cream solder sticking out from sides of the squeegee and cause the cream solder to return to the squeegee side.

SUMMARY OF THE INVENTION

Incidentally, the cream solder that has dried or undergone a chemical change due to a side leak and the like is retrieved or discarded by a worker. Since the cream solder contains metal such as lead, tin, silver, and copper and a chemical material such as a solvent and wax, discarding of the cream solder leads to an increase in costs and environmental deterioration.

In actuality, an amount of cream solder to be discarded is said to be 10% to 20% of the cream solder consumed. In this regard, a technique with which the amount of cream solder to be discarded can be reduced is demanded.

In view of the circumstances as described above, there is a need for a screen printing apparatus capable of reducing an amount of cream solder to be discarded and a squeegee mechanism used in the screen printing apparatus.

According to an embodiment of the present invention, there is provided a screen printing apparatus including a main squeegee and a pair of auxiliary squeegees.

The main squeegee includes a pair of end portions in a width direction. The main squeegee prints, by sliding in a direction orthogonal to the width direction on an upper surface of a screen that is supplied with a paste-like material and on which a hole is formed, the paste-like material on an upper surface of a printing object provided on a lower surface side of the screen via the hole.

The pair of auxiliary squeegees each include a first end portion and a second end portion. The pair of auxiliary squeegees are tilted a predetermined angle with respect to the main squeegee on a rear side of the main squeegee in the sliding direction.

The first end portion is provided more on an outer side than the corresponding one of the pair of end portions in the width direction.

The second end portion is provided more on an inner side than the corresponding one of the pair of end portions in the width direction.

According to the embodiment of the present invention, by the two auxiliary squeegees, the paste-like material such as a cream solder that has leaked from sides at both end portions of the main squeegee in the width direction can be caused to return to an area that is more on an inner side than the width of the main squeegee as well as on an inner side of the screen. The cream solder that has returned to the area that is more on the inner side than the width of the main squeegee is mixed with the cream solder on the front side of the main squeegee when the main squeegee and the pair of auxiliary squeegees slide above the screen again, to thus be retrieved.

As described above, in this embodiment, the cream solder that has leaked from the sides of the main squeegee returns to the area on the inner side of the screen by the two auxiliary squeegees to be recycled. With this structure, an amount of cream solder to be discarded can be reduced. As a result, cost cut and an improvement of environmental problems can be realized.

The screen printing apparatus may further include a main-squeegee holding member and a pair of auxiliary-squeegee holding members.

The main-squeegee holding member holds the main squeegee.

The pair of auxiliary-squeegee holding members are movable in a vertical direction with respect to the main-squeegee holding member and hold the pair of auxiliary squeegees.

In this embodiment, since the two auxiliary-squeegee holding members are movable in the vertical direction with respect to the main-squeegee holding member, adhesiveness of the pair of auxiliary squeegees with respect to the screen can be enhanced.

With this structure, it is possible to prevent a gap from being caused between the pair of auxiliary squeegees and the screen and the cream solder from remaining on the screen as a thin film. Particularly when the cream solder becomes a thin film and remains on the screen, the cream solder often needs to be discarded since a desiccation and a chemical change thereof are significant. Therefore, by enhancing the adhesiveness of the pair of auxiliary squeegees with respect to the screen to thus prevent a thin film from being formed on the screen with the structure described above, the amount of cream solder to be discarded can be additionally reduced.

In the screen printing apparatus, the pair of auxiliary-squeegee holding members may rotatably hold the pair of auxiliary squeegees.

Since the adhesiveness of the pair of auxiliary squeegees with respect to the screen can be additionally enhanced with this structure, the cream solder can be prevented from remaining on the screen as a thin film. As a result, the amount of cream solder to be discarded can be additionally reduced.

The screen printing apparatus may further include a pair of elastic bodies interposed between the main-squeegee holding member and the pair of auxiliary-squeegee holding members.

Since the adhesiveness of the pair of auxiliary squeegees with respect to the screen can be additionally enhanced with this structure, the cream solder can be prevented from remaining on the screen as a thin film. As a result, the amount of cream solder to be discarded can be additionally reduced.

In the screen printing apparatus, at least one of the main squeegee and the pair of auxiliary squeegees may include a groove formed along the width direction in the vicinity of a tip end portion that comes into contact with the screen.

In this embodiment, since a flexibility of the main squeegee and/or the pair of auxiliary squeegees can be enhanced by the groove, the adhesiveness of the main squeegee and/or the pair of auxiliary squeegees with respect to the screen can be enhanced. Accordingly, the cream solder can be prevented from remaining on the screen as a thin film, with the result that the amount of cream solder to be discarded can be additionally reduced.

The screen printing apparatus may further include a holding mechanism.

The holding mechanism holds the printing object. The holding mechanism horizontally supports, from below, an area of the screen on which one of the main squeegee and the pair of auxiliary squeegees slides/slide during screen printing.

Since the adhesiveness of the main squeegee or the pair of auxiliary squeegees with respect to the screen can be enhanced with this structure, the cream solder can be prevented from remaining on the screen as a thin film. As a result, the amount of cream solder to be discarded can be additionally reduced.

In the screen printing apparatus, the holding mechanism may include a pair of clamp members and a pair of correction members.

The pair of clamp members clamp the printing object and each include an upper surface that supports the area from below within substantially the same plane as the upper surface of the printing object during the screen printing.

The pair of correction members correct a deflection of the printing object and each include an upper surface that supports the area from below within substantially the same plane as the upper surface of the printing object and the upper surfaces of the pair of clamp members during the screen printing.

Since the adhesiveness of the main squeegee or the pair of auxiliary squeegees with respect to the screen can be enhanced with this structure, the cream solder can be prevented from remaining on the screen as a thin film.

As a result, the amount of cream solder to be discarded can be additionally reduced.

According to an embodiment of the present invention, there is provided a squeegee mechanism including a main squeegee and a pair of auxiliary squeegees.

The main squeegee includes a pair of end portions in a width direction. The main squeegee prints, by sliding in a direction orthogonal to the width direction on an upper surface of a screen that is supplied with a paste-like material and on which a hole is formed, the paste-like material on an upper surface of a printing object provided on a lower surface side of the screen via the hole.

The pair of auxiliary squeegees each include a first end portion and a second end portion. The pair of auxiliary squeegees are tilted a predetermined angle with respect to the main squeegee on a rear side of the main squeegee in the sliding direction.

The first end portion is provided more on an outer side than the corresponding one of the pair of end portions of the main squeegee in the width direction.

The second end portion is provided more on an inner side than the corresponding one of the pair of end portions of the main squeegee in the width direction.

As described above, according to the embodiments of the present invention, a screen printing apparatus capable of reducing an amount of cream solder to be discarded and a squeegee mechanism used in the screen printing apparatus can be provided.

These and other objects, features and advantages of the present invention will become more apparent in light of the following detailed description of best mode embodiments thereof, as illustrated in the accompanying drawings.

BRIEF DESCRIPTION OF DRAWINGS

FIG. 13 are a top view and a side view of the squeegee portion and the screen for explaining an operation of the squeegee portion;

DESCRIPTION OF PREFERRED EMBODIMENTS

Hereinafter, embodiments of the present invention will be described with reference to the drawings.

<First Embodiment>

(Overall Structure of Screen Printing Apparatus)

Figure 1:
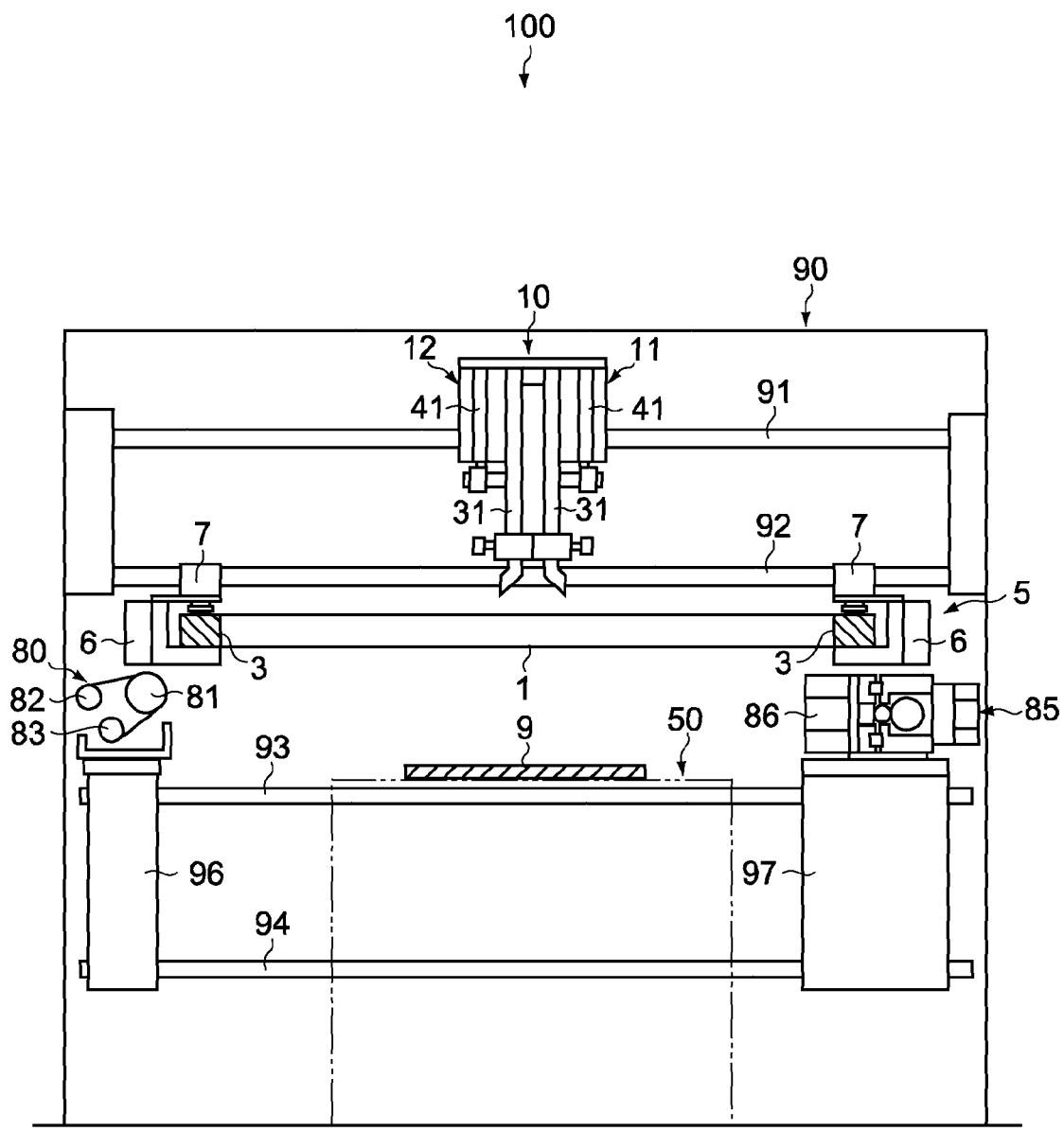
FIG. 1 is a front view of a screen printing apparatus according to an embodiment of the present invention.
Figure 2:
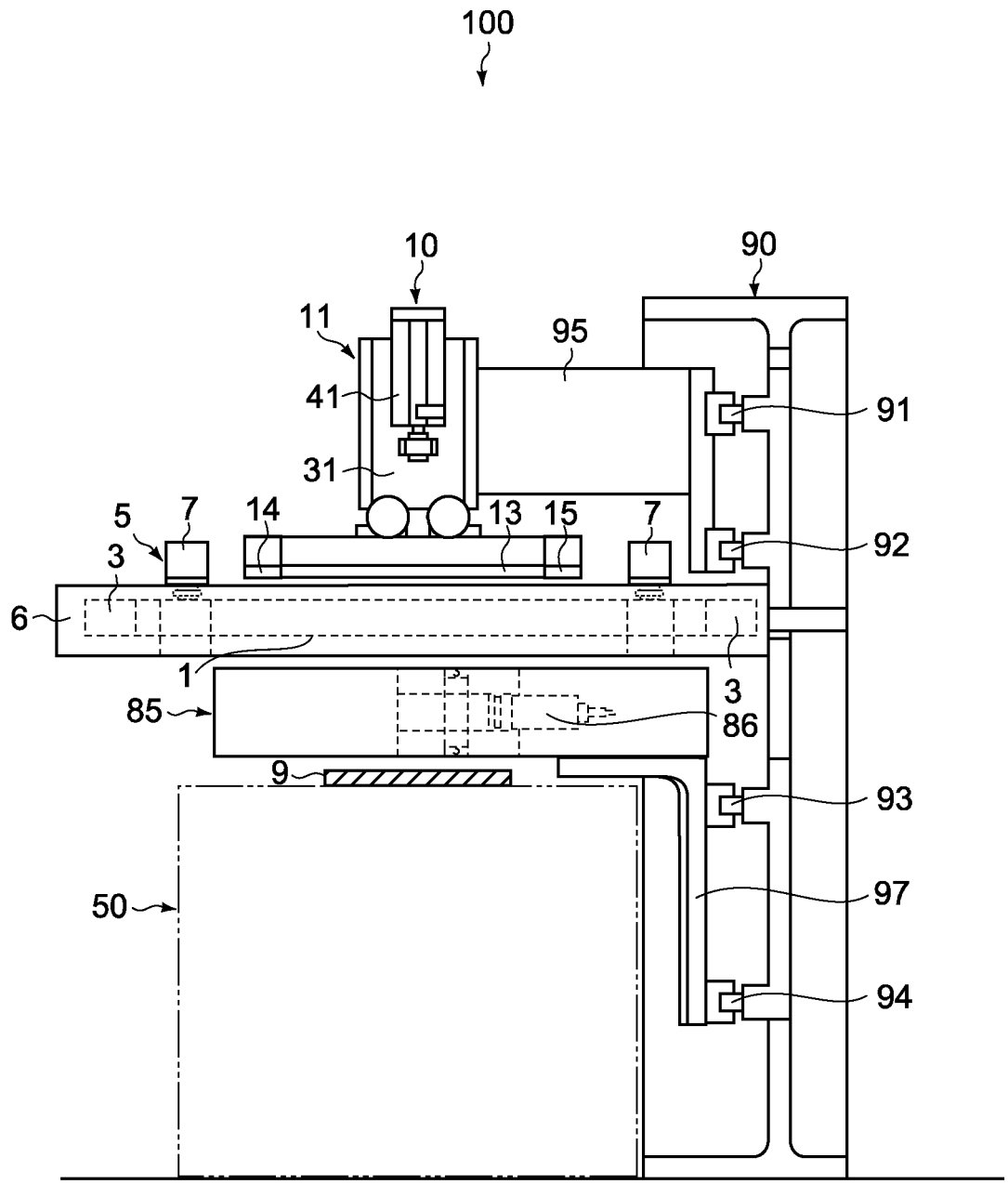
FIG. 2 is a side view of the screen printing apparatus according to the embodiment of the present invention.

FIG. 1 is a front view showing a screen printing apparatus according to a first embodiment of the present invention. FIG. 2 is a side view of the screen printing apparatus. It should be noted that, to help understand the figures to be described in the specification, the screen printing apparatus, members included in the screen printing apparatus, and the like may be illustrated in sizes different from actual sizes thereof.

As shown in FIGS. 1 and 2, a screen printing apparatus 100 includes a screen 1 and a fixing portion 5 that fixes the screen 1 to the screen printing apparatus 100 at a predetermined position. The screen printing apparatus 100 also includes a squeegee portion 10 that is provided above the screen 1 and slides above an upper surface of the screen 1 to which a paste-like material such as a cream solder 4 (see FIGS. 13 and 14) is supplied.

Further, the screen printing apparatus 100 includes a positioning portion 50 that is provided below the screen 1 and positions a print substrate 9 as a screen printing object, a cleaning portion 80 that cleans a lower surface of the screen 1, and a camera portion 85.

Moreover, the screen printing apparatus 100 includes a support base 90 that movably supports the squeegee portion 10, the cleaning portion 80, and the camera portion 85 on a back side of the screen printing apparatus 100. Furthermore, the screen printing apparatus 100 includes a carry-in conveyor 98 (see FIG. 8) for carrying in the print substrate 9 that is not yet processed (before printing) from outside and a discharge conveyor 99 (see FIG. 8) for taking out the print substrate 9 that has been processed (after printing).

At an upper portion of the support base 90, a pair of upper guide rails 91 and 92 are provided along a y-axis direction. At a lower portion of the support base 90, a pair of lower guide rails 93 and 94 are provided along the y-axis direction.

To the upper guide rails 91 and 92, a carriage 95 that supports the squeegee portion 10 is attached movably. With this structure, the squeegee portion 10 is movable above the screen 1 in the y-axis direction.

On the other hand, to the lower guide rails 93 and 94, a carriage 96 that supports the cleaning portion 80 and a carriage 97 that supports the camera portion 85 are attached movably. With this structure, the cleaning portion 80 and the camera portion 85 are movable below the screen 1 in the y-axis direction.

(Structure of Screen and Fixing Portion)

Figure 3:
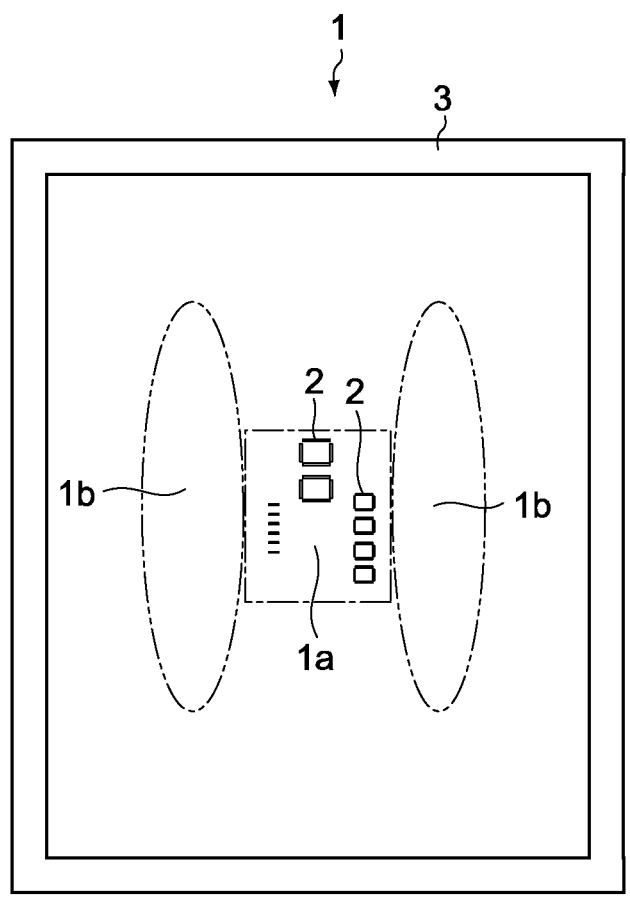
FIG. 3 is a top view of a screen.

FIG. 3 is a top view of the screen 1.

As shown in FIG. 3, at substantially the center of the screen 1, pattern holes 2 corresponding to a wiring pattern of the print substrate 9 are formed in an area 1a (see area enclosed by dashed line) corresponding to a size of the print substrate 9. An area other than the area 1a in which the pattern holes 2 are formed is a marginal area. It should be noted that in descriptions below, the area in which the pattern holes 2 are formed, which corresponds to the size of the print substrate 9, will be referred to as pattern-hole forming area 1a. Moreover, in descriptions below, predetermined areas on both sides of the pattern-hole forming area 1a in a width direction (x-axis direction) will be referred to as side areas (see areas enclosed by two-dot chain lines).

The screen 1 is formed of, for example, metal such as stainless steel. A longitudinal width (y-axis direction) and a lateral width (x-axis direction) of the screen 1 are, for example, 500 mm to 800 mm, and a thickness of the screen 1 is, for example, 0.1 mm. Further, a longitudinal width (y-axis direction) and a lateral width (x-axis direction) of the pattern-hole forming area 1a are, for example, 120 mm to 160 mm. It should be noted that a material and size of the screen 1, a size of the pattern-hole forming area 1a, and the like are not particularly limited.

On the screen 1, a frame body 3 is formed along four sides of the screen 1. The frame body 3 is pulling the screen 1 from four directions with a predetermined tensile force so that the screen 1 does not sag.

Referring back to FIGS. 1 and 2, the fixing portion 5 that fixes the screen 1 to the screen printing apparatus 100 at a predetermined position includes an attachment frame 6 and a screen clamp 7 that is provided on the attachment frame 6 and clamps the screen 1. The attachment frame 6 is supported by the support base 90, a support (not shown), or the like. The screen clamp 7 is provided plurally on the attachment frame 6. The screen clamps 7 fix the frame body 3 provided on the screen 1 from both sides in the vertical direction.

(Structure of Squeegee Portion)

Figure 4:
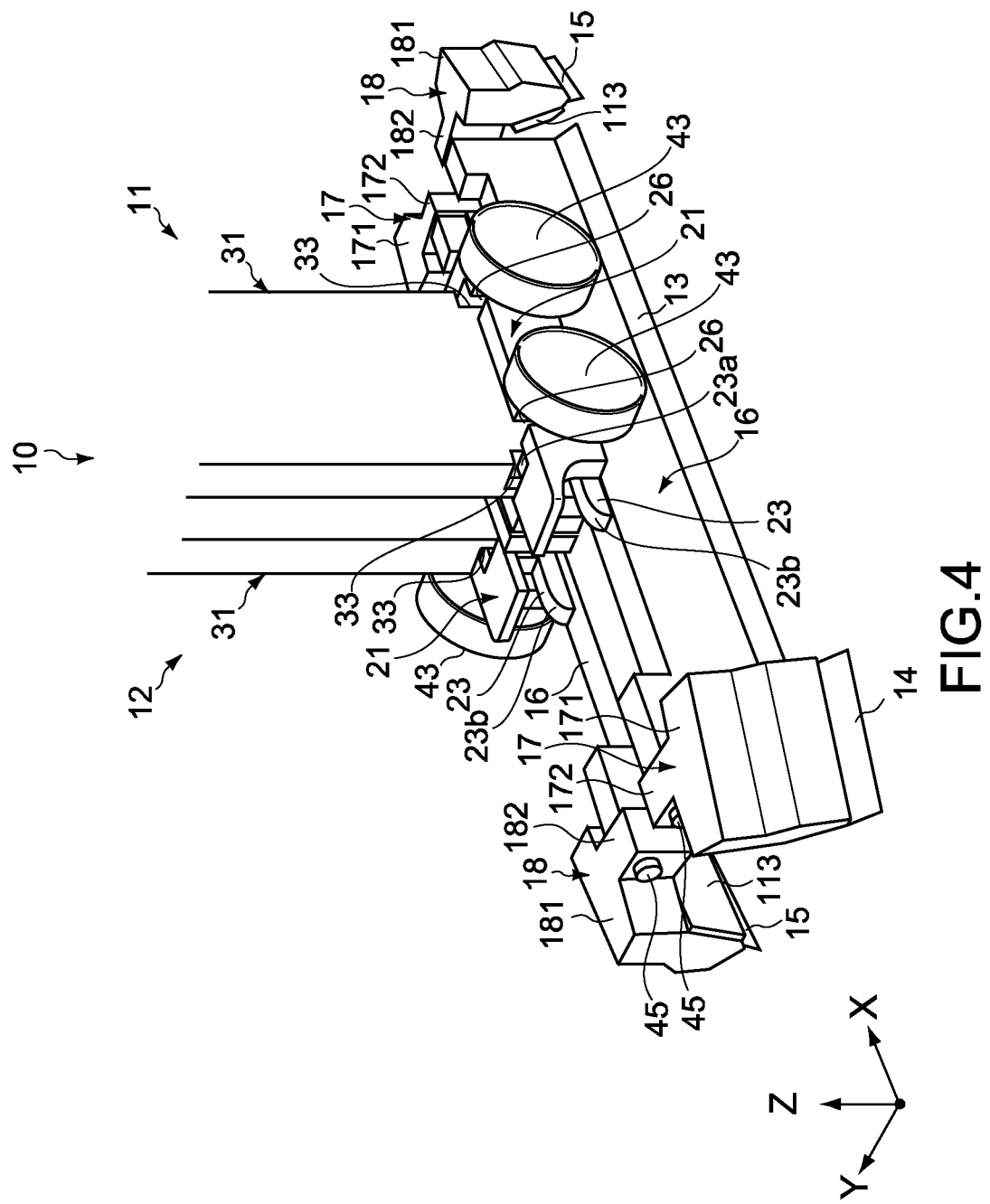
FIG. 4 is a perspective view of a squeegee portion.

FIG. 4 is a perspective view of the squeegee portion 10.

As shown in FIGS. 1 and 4, the squeegee portion 10 has a structure in which two squeegee mechanisms 11 and 12 are arranged symmetrically using an x-z plane as a symmetry plane. In descriptions below, out of the two squeegee mechanisms 11 and 12, the squeegee mechanism 11 provided on the right-hand side when seen from the front side of the screen printing apparatus 100 will be referred to as first squeegee mechanism 11, and the squeegee mechanism 12 provided on the left-hand side will be referred to as second squeegee mechanism 12.

Since the first squeegee mechanism 11 and the second squeegee mechanism 12 have the same structure, members of the first squeegee mechanism 11 and the second squeegee mechanism 12 are denoted by the same symbols in the specification, and the first squeegee mechanism 11 will be described as a representative.

Figure 5:
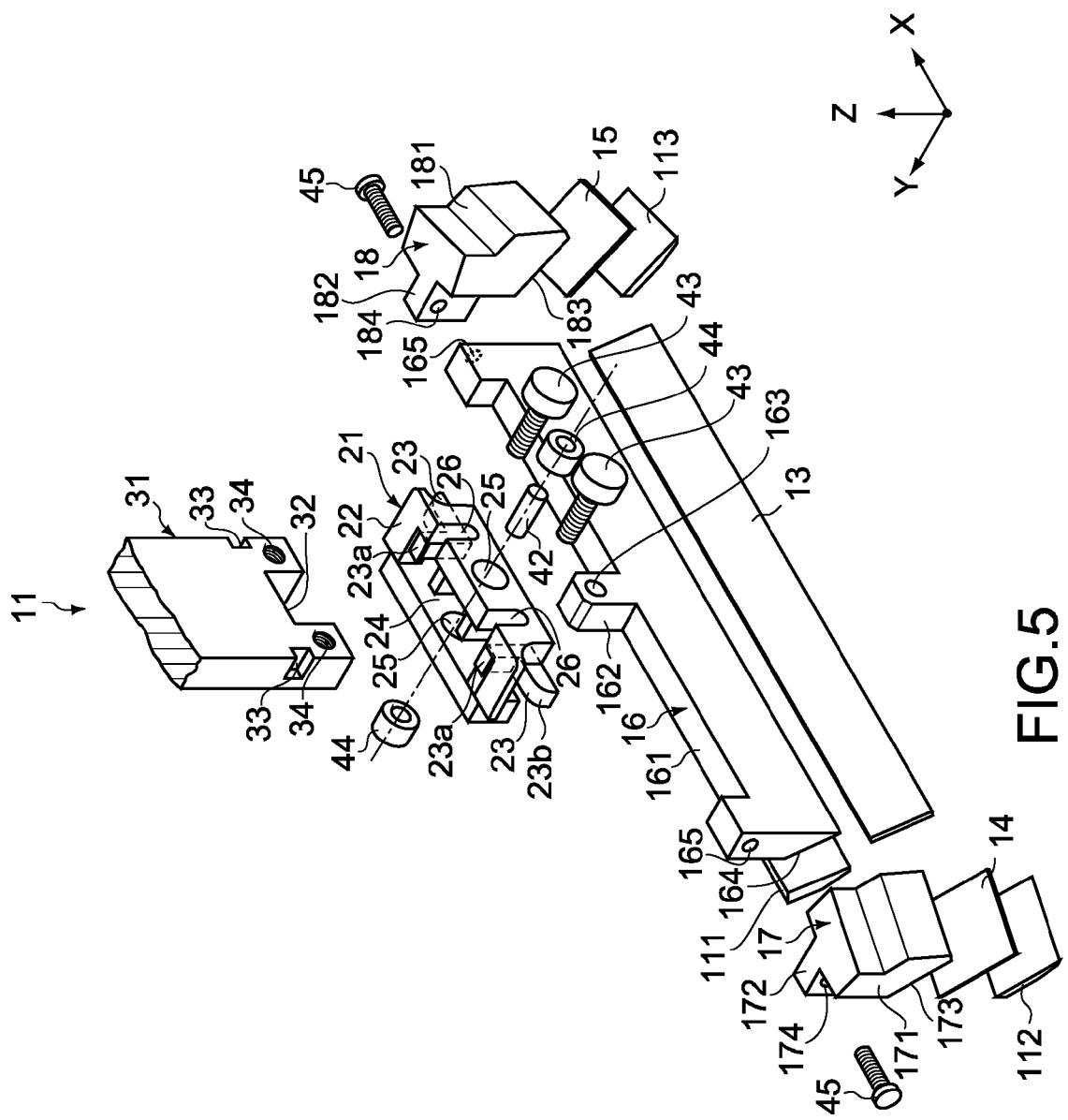
FIG. 5 is an exploded perspective view of a squeegee mechanism.

FIG. 5 is an exploded perspective view of the squeegee mechanism.

As shown in FIGS. 4 and 5, the first squeegee mechanism 11 includes a main squeegee 13 and a pair of auxiliary squeegees 14 and 15 provided at both ends of the main squeegee 13 in a width direction (x-axis direction).

The first squeegee mechanism 11 also includes a squeegee holding member 16 that holds the main squeegee 13, a retainer plate 111 for fixing the main squeegee 13 to the squeegee holding member 16, a pair of auxiliary-squeegee holding members 17 and 18 for holding the pair of auxiliary squeegees 14 and 15, respectively, and retainer plates 112 and 113 for fixing the auxiliary squeegees 14 and 15 to the auxiliary-squeegee holding members 17 and 18, respectively. Furthermore, the first squeegee mechanism 11 includes a support member 31 that supports the squeegee holding member 16, a coupling bracket 21 that couples the support member 31 and the squeegee holding member 16, and an air cylinder 41 (see FIGS. 1 and 2) that vertically drives the support member 31.

The air cylinder 41 vertically moves the first squeegee mechanism 11 to bring the main squeegee 13 and the auxiliary squeegees 14 and 15 into contact with the screen 1 with a predetermined pressure. It should be noted that in a state where the first squeegee mechanism 11 is lowered and brought into contact with the screen 1, the second squeegee mechanism 12 is not lowered and is thus not brought into contact with the screen 1 (see FIG. 13B). On the contrary, in a state where the second squeegee mechanism 12 is lowered and brought into contact with the screen 1, the first squeegee mechanism 11 is not lowered and is thus not brought into contact with the screen 1 (see FIG. 14B).

The support member 31 includes a concave portion 32 near a center of a lower end portion thereof and a pair of engagement grooves 33 provided at both ends thereof in the width direction (x-axis direction) on the lower portion side. The support member 31 also includes a pair of screw holes 34 provided on both sides of the concave portion 32 at the lower portion side thereof.

The coupling bracket 21 includes a coupling bracket body 22 and a pair of hook levers 23 provided on side wall portions of the coupling bracket body 22 in the width direction (x-axis direction).

The coupling bracket body 22 includes, at an upper portion thereof, an insertion opening 24 into which the lower end portion of the support member 31 is inserted. Penetrating openings 25 through each of which a shaft 42 is inserted are formed on wall portions on the front and back sides of the coupling bracket body 22. Also formed on the wall portion on the front side of the coupling bracket body 22 are a pair of grooves 26 that are formed on both sides of the penetrating opening 25 and used for passing through tightening screws 43.

The hook levers 23 are rotatable with respect to the coupling bracket body 22 about an axis in the y-axis direction. The hook levers 23 each include a claw portion 23a at an upper portion thereof and a gripper 23b at a lower portion thereof. The claw portions 23a engage with the engagement grooves 33 provided on the support member 31 in a state where the lower end portion of the support member 31 is inserted into the insertion opening 24 of the coupling bracket 21. The grippers 23b each protrude outwardly from the side wall portion of the coupling bracket body 22 in the width direction. By the grippers 23b being gripped and the hook levers 23 being rotated with respect to the coupling bracket body 22, the support member 31 and the coupling bracket 21 are switched between a temporarily-fixed state and a released state.

The two tightening screws 43 are passed through the grooves 26 formed on the wall portion on the front side of the coupling bracket body 22 and screwed to the screw holes 34 formed on the support member 31. Accordingly, the support member 31 and the coupling bracket 21 are fixed firmly.

The squeegee holding member 16 is a plate-like member elongated in the width direction (x-axis direction) and includes a squeegee holding member body 161 and a protrusion 162 that is provided near a center of the squeegee holding member body 161 and protrudes upwardly from the squeegee holding member body 161.

A penetrating opening 163 into which a shaft 42 is inserted is formed on the protrusion 162 in association with the penetrating openings 25 formed on the coupling bracket 21. The shaft 42 is inserted into the penetrating openings 25 of the coupling bracket 21 and the penetrating opening 163 of the squeegee holding member 16. Bearings 44 are interposed between the penetrating openings 25 of the coupling bracket 21 and the shaft 42. Accordingly, the squeegee holding member 16 is rotatably attached to the coupling bracket 21. The squeegee holding member body 161 includes a slope 164 on a back side thereof and screw holes 165 on both side surfaces thereof in the width direction. The slope 164 is tilted a predetermined angle with respect to a horizontal plane (x-y plane).

The main squeegee 13 has a shape of a thin rectangular plate elongated in the width direction (x-axis direction) and formed of, for example, metal such as stainless steel. However, the material of the main squeegee 13 is not limited to metal. A resin such as a urethane may be used as the material of the main squeegee 13, or other materials may be used instead.

The retainer plate 111 is provided on the back side of the squeegee holding member 16. The retainer plate 111 sandwiches and fixes the main squeegee 13 with the slope 164 of the squeegee holding member 16.

The pair of auxiliary-squeegee holding members 17 and 18 are respectively provided at both ends of the squeegee holding member 16 in the width direction (x-axis direction). The auxiliary-squeegee holding members 17 and 18 respectively include auxiliary-squeegee holding member bodies 171 and 181 and coupling portions 172 and 182 protruding from the back side of the auxiliary-squeegee holding member bodies 171 and 181.

The auxiliary-squeegee holding member bodies 171 and 181 respectively include, on back sides thereof, slopes 173 and 183 that are tilted a predetermined angle with respect to the horizontal plane (x-y plane) and also tilted a predetermined angle with respect to the x-z plane.

On the coupling portions 172 and 182, screw holes 174 and 184 are formed respectively in association with the screw holes 165 formed at both ends of the squeegee holding member 16 in the width direction (x-axis direction). Screws 45 are screwed to the screw holes 165 of the squeegee holding member 16 via the screw holes 174 and 184 of the coupling portions 172 and 182, respectively. Accordingly, the auxiliary-squeegee holding members 17 and 18 are fixed to the squeegee holding member 16 at both ends of the squeegee holding member 16 in the width direction (x-axis direction).

The auxiliary squeegees 14 and 15 each have a shape of a thin rectangular plate and are formed of, for example, metal such as stainless steel. However, the material of the auxiliary squeegees 14 and 15 is not limited to metal. A resin such as a urethane may be used as the material of the auxiliary squeegees 14 and 15, or other materials may be used instead.

As described above, any material may be used for the auxiliary squeegees 14 and 15, but a material used for the auxiliary squeegees 14 and 15 is typically a material having the same hardness as the material used for the main squeegee 13 or a material that is softer than the material of the main squeegee 13. When a material harder than that of the main squeegee 13 is used for the auxiliary squeegees 14 and 15, a force with which the auxiliary squeegees 14 and 15 are brought into contact with the screen 1 may become too large, with the result that an area of the screen 1 near the center rises depending on a backup structure and the like. In this regard, the material used for the auxiliary squeegees 14 and 15 is typically a material that has the same hardness as the material used for the main squeegee 13 or a material that is softer than the material of the main squeegee 13.

The retainer plates 112 and 113 are provided on the back sides of the auxiliary-squeegee holding members 17 and 18, respectively. The retainer plates 112 and 113 sandwich and fix the auxiliary squeegees 14 and 15 with the slopes 173 and 183 of the auxiliary-squeegee holding members 17 and 18, respectively.

Figure 6:
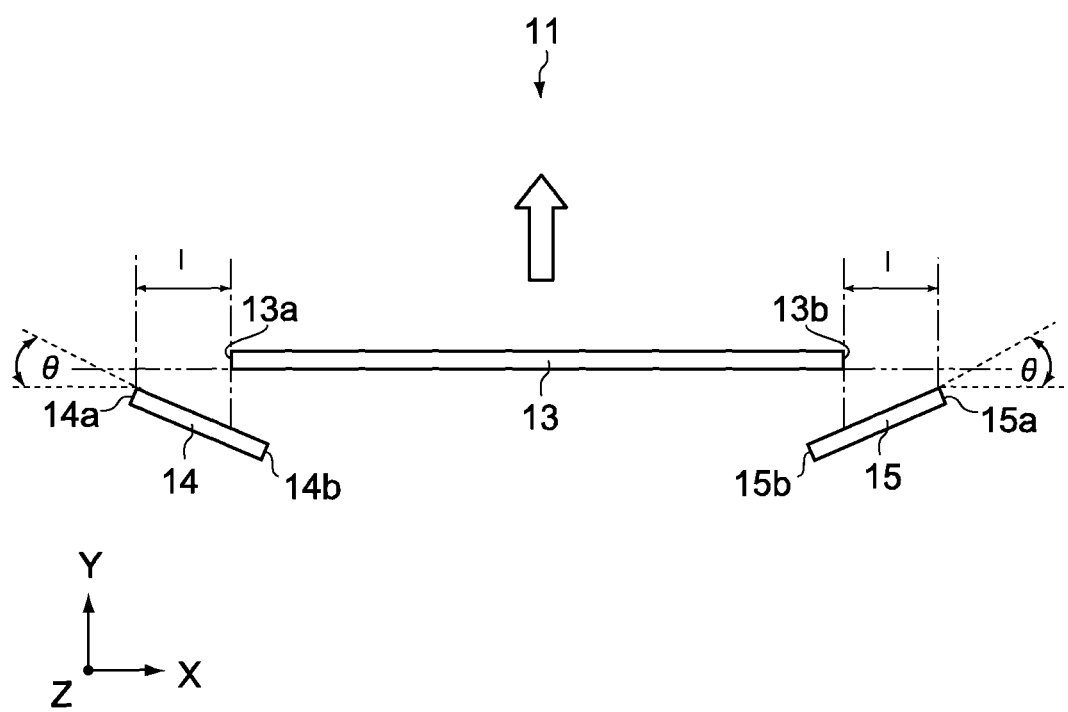
FIG. 6 is a schematic diagram showing a main squeegee and auxiliary squeegees from above.

FIG. 6 is a schematic diagram of the main squeegee 13 and the auxiliary squeegees 14 and 15 seen from above. In FIG. 6, to help understand the figure, tip end portions of the main squeegee 13 and the auxiliary squeegees 14 and 15 are illustrated schematically.

It should be noted that in descriptions below, for convenience, a front side regarding a direction in which the first squeegee mechanism 11 slides on the screen 1 will be described as the front, and a rear side will be described as the back. The front side of the sliding direction corresponds to the back side of the first squeegee mechanism 11, and the back side of the sliding direction corresponds to the front side of the first squeegee mechanism 11.

As shown in FIG. 6, the pair of auxiliary squeegees 14 and 15 are tilted a predetermined angle θ with respect to the main squeegee 13. It should be noted that in descriptions below, an angle formed by the main squeegee 13 and the auxiliary squeegees 14 and 15 is described as a skew angle θ.

The auxiliary squeegees 14 and 15 are provided on the rear side of the main squeegee 13 as a whole. Outer end portions 14a and 15a of the auxiliary squeegees 14 and 15, respectively, are provided more on an outer side than end portions 13a and 13b of the main squeegee 13 in the width direction (x-axis direction) on the rear side of the main squeegee 13, whereas inner end portions 14b and 15b of the auxiliary squeegees 14 and 15, respectively, are provided more on an inner side than the end portions 13a and 13b of the main squeegee 13 in the width direction (x-axis direction) on the rear side of the main squeegee 13.

By the auxiliary squeegees 14 and 15, the cream solder 4 that has leaked from sides of the end portions 13a and 13b of the main squeegee 13 in the width direction at a time the main squeegee 13 slides on the screen 1 can be caused to return to an inner side of the screen 1.

Values of the skew angle θ, a length l of the auxiliary squeegees 14 and 15 protruding outwardly from the end portions 13a and 13b of the main squeegee 13 (hereinafter, referred to as protrusion length l), and the like are set so that the cream solder 4 that has leaked from the sides of the main squeegee 13 is gathered on the inner side of the screen 1. The values of the skew angle θ, the protrusion length l, and the like will be described later in detail.

Figure 7A:
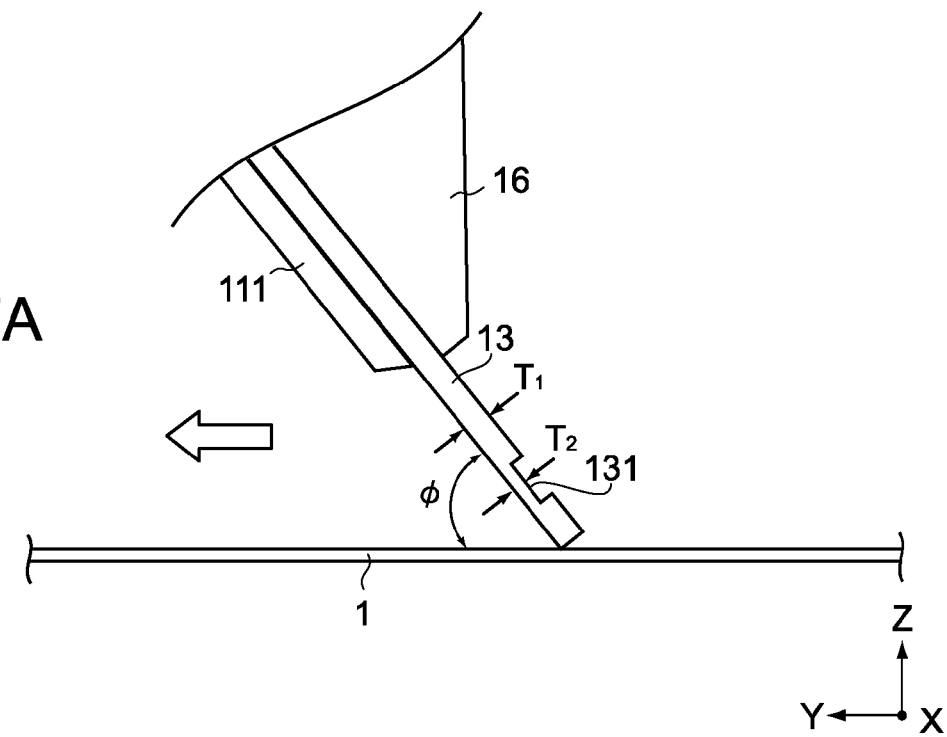
FIG. 7 are side views of the main squeegee.
Figure 7B:
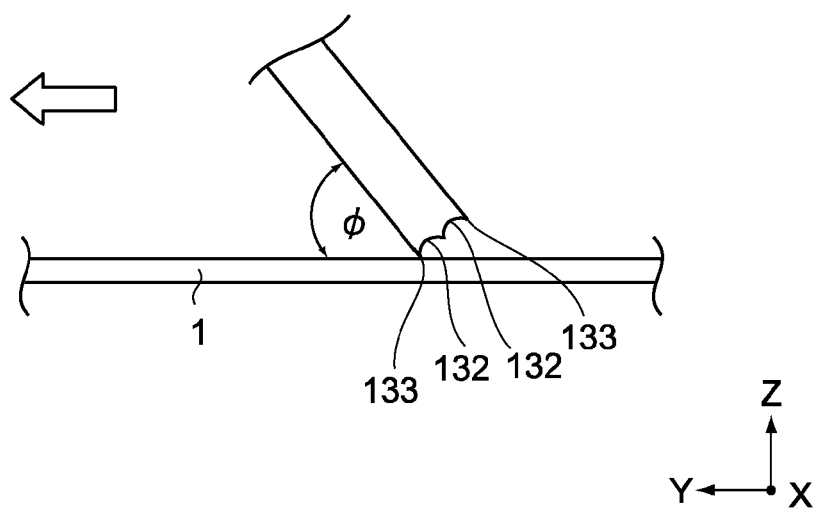

FIG. 7 are side views of the main squeegee. FIG. 7A is a side view of the entire main squeegee 13, and FIG. 7B is an enlarged side view of a tip end portion of the main squeegee 13.

As shown in FIG. 7A, the main squeegee 13 has a tilt angle ϕ with respect to the horizontal plane (x-y plane) and held by the squeegee holding member 16 so as to come into contact with the screen 1 at the tilt angle ϕ. The tilt angle ϕ is, for example, 60 degrees, though not limited thereto.

On a surface of the main squeegee 13 on the back side of the sliding direction (front side of first squeegee mechanism 11) in the vicinity of the tip end portion thereof, a groove 131 is formed along the width direction (x-axis direction) of the main squeegee 13. A thickness $T_2$ of a portion where the groove 131 is formed is about half the thickness $T_1$ of the main squeegee 13. For example, when the thickness $T_1$ of the main squeegee 13 is 0.3 mm, the thickness $T_2$ of the portion where the groove 131 is formed is about 0.15 mm. The groove 131 is formed by, for example, etching or cutting work. Since a flexibility of the main squeegee 13 can be enhanced by the groove 131, adhesiveness of the main squeegee 13 with respect to the screen 1 can be enhanced.

As shown in FIG. 7B, on a tip end surface of the main squeegee 13, two curved grooves 132 are aligned in the width direction of the main squeegee 13. By the curved grooves 132, edge portions 133 of the main squeegee 13 are formed sharply.

It should be noted that although the descriptions on FIG. 7 have been mainly given on the structure of the main squeegee 13, the auxiliary squeegees 14 and 15 have structures similar to that of the main squeegee 13. In other words, the auxiliary squeegees 14 and 15 are respectively held by the auxiliary-squeegee holding members 17 and 18 so as to come into contact with the screen 1 at a predetermined tilt angle. Moreover, on surfaces of the auxiliary squeegees 14 and 15 on the back side of the sliding direction in the vicinity of the tip end portions thereof, grooves are formed along the width direction of the auxiliary squeegees 14 and 15. Further, on a tip end surface of each of the auxiliary squeegees 14 and 15, curved grooves are formed in the width direction.

A tilt angle ϕ of the auxiliary squeegees 14 and 15 may either be the same as or different from the tilt angle ϕ of the main squeegee 13. The tilt angle ϕ of the auxiliary squeegees 14 and 15 and the tilt angle ϕ of the main squeegee 13 are set as appropriate based on a sliding velocity of the squeegee portion 10, a material and viscosity of the cream solder 4, and the like.

(Structure of Positioning Portion)

Figure 8:
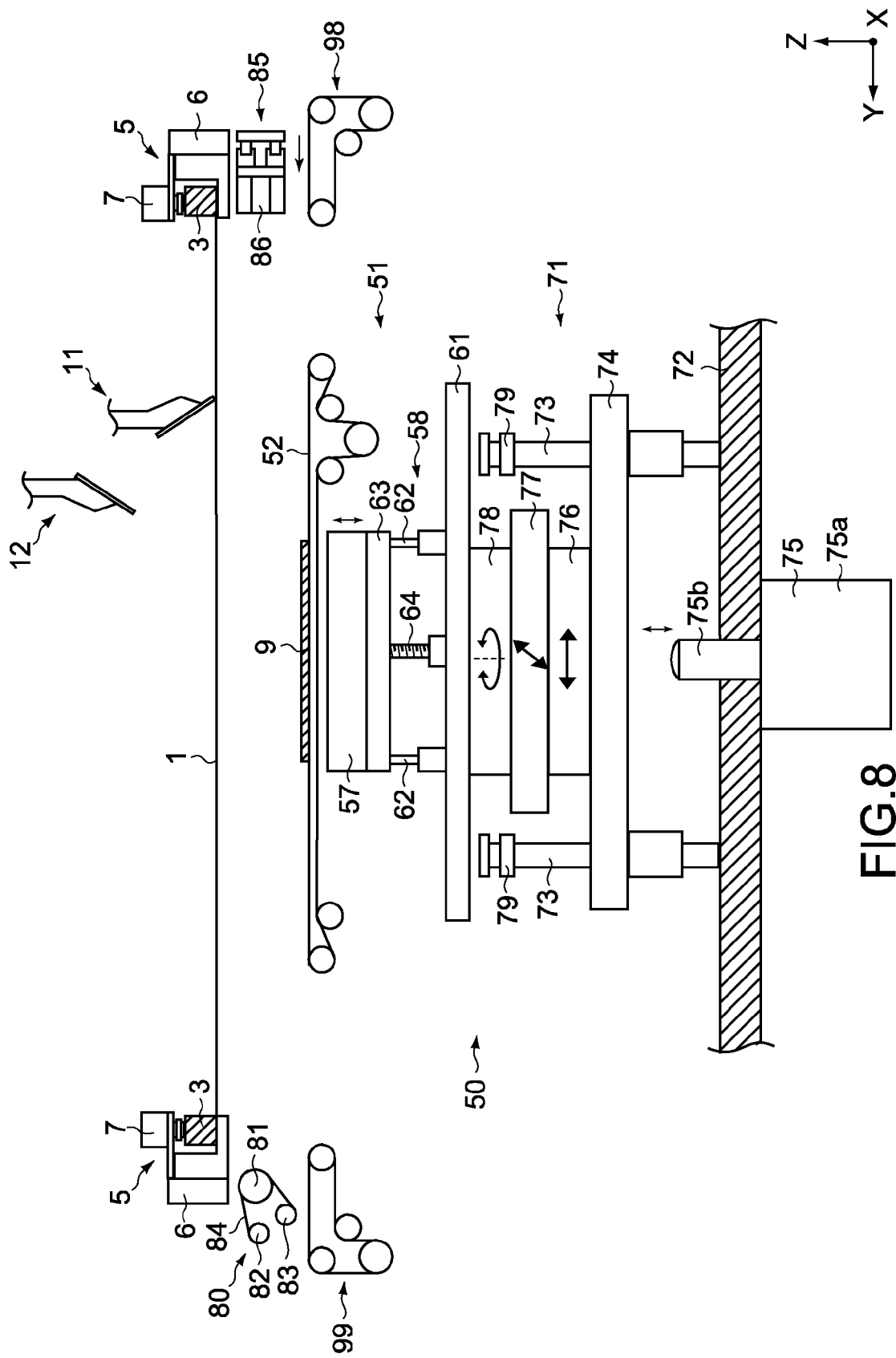
FIG. 8 is a front view of a positioning portion.
Figure 9:
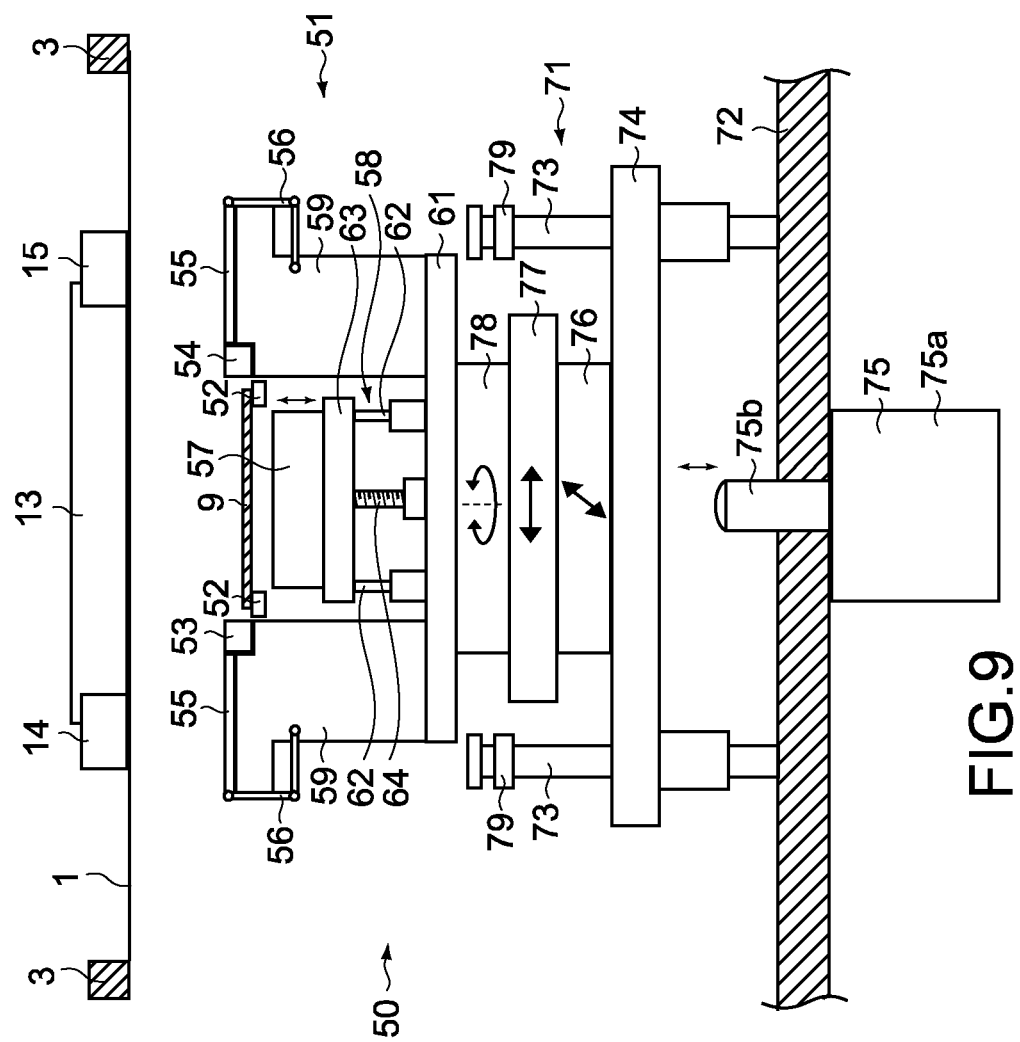
FIG. 9 is a side view of the positioning portion.

FIG. 8 is a front view of a positioning portion, and FIG. 9 is a side view of the positioning portion. In FIG. 8, to help understand the figure, an illustration of a part of a substrate holding mechanism of the positioning portion is omitted. It should be noted that in descriptions on FIGS. 8 and 9, the y-axis direction will be described as a longitudinal direction of the positioning portion, and the x-axis direction will be described as a width direction of the positioning portion.

As shown in the figures, a positioning portion 50 includes a substrate holding mechanism 51 that holds the print substrate 9 and a moving mechanism 71 that moves the substrate holding mechanism 51 in predetermined directions (x-axis direction, y-axis direction, z-axis direction, and θ-axis direction (rotational direction about z axis)) as well as support the substrate holding mechanism 51 from below.

The substrate holding mechanism 51 that holds the print substrate 9 will first be described.

The substrate holding mechanism 51 includes a pair of conveyor belts 52 that convey the print substrate 9, a pair of substrate clamps 53 and 54 that clamp the print substrate 9 conveyed by the conveyor belts 52, and a pair of substrate correction clamps 55 for correcting the print substrate 9. The substrate holding mechanism 51 also includes four arms 56 that displace the substrate correction clamps 55 to an operating position and a standby position, a suction block 57 that sticks to and holds the print substrate 9, and a lifting portion 58 for hoisting the suction block 57. Furthermore, the substrate holding mechanism 51 includes a pair of clamp support members 59 that support the conveyor belts 52, the substrate clamps 53 and 54, and the substrate correction clamps 55, and a support plate 61 that supports the members from below.

The conveyor belts 52 are elongated in the longitudinal direction (y-axis direction). The conveyor belts 52 are provided with an interval that is larger than a width of the suction block 57 so that the suction block 57 can move vertically between the conveyor belts 52.

The carry-in conveyor 98 for carrying in the print substrate 9 that is not yet processed is provided on an upstream side of the conveyor belts 52 (right-hand side of FIG. 8), and the discharge conveyor 99 for taking out the print substrate 9 that has been processed is provided on a downstream side of the conveyor belts 52 (left-hand side of FIG. 8).

The conveyor belts 52 guide the processed print substrate 9 to the discharge conveyor 99 as well as guide the unprocessed print substrate 9 carried in from the carry-in conveyor 98 to a position above the suction block 57.

The suction block 57 provided at substantially the center of the substrate holding mechanism 51 includes a plurality of suction holes on an upper surface thereof. The suction block 57 is coupled to a vacuum pump (not shown) and sticks to and holds the print substrate 9 via the suction holes by driving of the vacuum pump.

The lifting portion 58 that raises and lowers the suction block 57 is supported by four z-axis guides 62 erected on the support plate 61, a lifting table 63 that is supported by the z-axis guides 62 in a liftable state and supports the suction block 57, and a ball screw 64 that is provided to the lifting table 63. The ball screw 64 is rotated by driving of a drive portion (not shown) such as a motor and moves the lifting table 63 with respect to the support plate 61 in the z-axis direction. Accordingly, the suction block 57 is movable in the vertical direction with respect to the support plate 61.

The clamp support members 59 are provided while facing each other at both ends of the support plate 61 in the width direction (x-axis direction) so as to sandwich the suction block 57. The clamp support members 59 totally support the substrate clamps 53 and 54 and the substrate correction clamps 55 from below at an upper portion of the clamp support members 59.

The substrate clamps 53 and 54 are provided on the pair of clamp support members 59, respectively, while opposing each other. The substrate clamps 53 and 54 have a shape that is elongated in the longitudinal direction (y-axis direction). The substrate clamps 53 and 54 are arranged with an interval larger than the width of the print substrate 9 therebetween so that the print substrate 9 can be conveyed on the conveyor belts 52. Of the two substrate clamps 53 and 54, the substrate clamp 53 on the front side of the screen printing apparatus 100 (left-hand side of FIG. 9) is fixed to the clamp support member 59, whereas the substrate clamp 54 on the back side of the screen printing apparatus 100 (right-hand side of FIG. 9) is movable with respect to the clamp support member 59 in the width direction (x-axis direction). In descriptions below, the substrate clamp 53 fixed to the clamp support member 59 may be referred to as fixed clamp 53, and the substrate clamp 54 that is movable with respect to the clamp support member 59 may be referred to as movable clamp 54.

The substrate clamps 53 and 54 sandwich and fix the print substrate 9 conveyed to the position above the suction block 57 from both sides by the movement of the movable clamp 54.

The substrate correction clamps 55 are provided on the pair of clamp support members 59, respectively. The substrate correction clamps 55 are each a plate-like member and are respectively provided in the vicinity of the substrate clamps 53 and 54 on outer sides of the substrate clamps 53 and 54 in the width direction (x-axis direction). Widths of the substrate correction clamps 55 are set to be somewhat large, and outer end portions of the substrate correction clamps 55 in the width direction (x-axis direction) are more on the outer side than the outer end portions of the auxiliary squeegees 14 and 15 provided above the screen 1.

The arms 56 are provided two each with respect to the pair of substrate correction clamps 55. For example, the arms 56 are provided so that the end portion of the substrate correction clamp 55 in the longitudinal direction (y-axis direction) is coupled to a side surface of the clamp support member 59 in the longitudinal direction. The arms 56 are structured by, for example, a parallel linkage, though not limited thereto.

The arms 56 displace the substrate correction clamps 55 to a standby position and an operating position by driving of a drive portion (not shown) such as a motor. The substrate correction clamps 55 press both end portions of the print substrate 9 in the width direction (x-axis direction) from above at the operating position. It should be noted that FIG. 9 shows a state where the substrate correction clamps 55 are at the standby position.

Here, the upper surfaces of the substrate clamps 53 and 54 and the upper surfaces of the substrate correction clamps 55 at the standby position are at substantially the same height. In other words, the upper surfaces of the substrate clamps 53 and 54 and the upper surfaces of the substrate correction clamps 55 are on substantially the same plane. Various values including the height of the clamp support members 59, the height of the substrate clamps 53 and 54, and the height of the substrate correction clamps 55 are set so that the upper surfaces of the substrate clamps 53 and 54 and the upper surfaces of the substrate correction clamps 55 are arranged on substantially the same plane.

Next, the moving mechanism 71 that moves the substrate holding mechanism 51 in predetermined directions (x-axis direction, y-axis direction, z-axis direction, θ-axis direction (rotational direction about z axis)) will be described.

The moving mechanism 71 includes four z-axis guides 73 erected on a base 72, a z-axis table 74 that is supported by the z-axis guides 73 while being movable in the vertical direction, and an air cylinder 75 that vertically moves the z-axis table 74. The moving mechanism 71 also includes a y-axis table 76 provided on the z-axis table 74, an x-axis table 77 provided on the y-axis table 76, and a θ-axis table 78 provided on the x-axis table 77.

The air cylinder 75 includes an air cylinder body 75a and a rod 75b provided to the air cylinder body 75a. The air cylinder 75 is fixed to the base 72 at a position below the z-axis table 74. By driving the air cylinder 75, the rod 75b is driven vertically, and the z-axis table 74 thus moves vertically. By the vertical movement of the z-axis table 74, the substrate holding mechanism 51 is moved vertically.

Stoppers 79 are provided at upper portions of the z-axis guides 73. By the stoppers 79, an upward movement of the z-axis table 74 is restricted. A position of the stoppers 79 is adjusted so that, when the substrate holding mechanism 51 is moved upwardly by the movement of the z-axis table 74, the upper surface of the print substrate 9, the upper surfaces of the substrate clamps 53 and 54, and the upper surfaces of the substrate correction clamps 55 appropriately come into contact with the lower surface of the screen 1.

The y-axis table 76 is slidably attached to rails (not shown) that extend in the y-axis direction on the z-axis table 74.

The x-axis table 77 is slidably attached to rails (not shown) that extend in the x-axis direction on the y-axis table 76.

The y-axis table 76 and the x-axis table 77 move in the x- and y-axis directions by driving of a drive portion (not shown). Accordingly, the substrate holding mechanism 51 move in the x- and y-axis directions.

The θ-axis table 78 is provided on a rotary drive portion (not shown) provided on the x-axis table 77. The θ-axis table 78 rotates about the axis in the z-axis direction by driving of the rotary drive portion to thus rotate the substrate holding mechanism 51 provided above the θ-axis table 78 about the z axis.

(Structures of Cleaning Portion and Camera Portion)

As shown in FIGS. 1, 2, and 8, the camera portion 85 includes an image recognition camera 86. The image recognition camera 86 recognizes an alignment mark provided at a predetermined position on the print substrate 9 for positioning the print substrate 9.

As shown in FIGS. 1 and 8, the cleaning portion 80 provided below the screen 1 includes a roller 81, a payout roller 82 that pays out a cleaning tape 84, and a take-up roller 83 that takes up the cleaning tape 84. When the cleaning portion 80 is moved in the y-axis direction, the roller 81, the payout roller 82, and the take-up roller 83 rotate in an interlocking manner. The cleaning tape 84 paid out from the payout roller 82 rotates around the roller 81 while being in contact with the lower surface of the screen 1 and is taken up by the take-up roller 83. Accordingly, the lower surface of the screen 1 is cleaned.

(Descriptions on Operation)

Next, an operation of the screen printing apparatus 100 of this embodiment will be described.

(Operation of Positioning Portion)

First, an operation of the positioning portion 50 will be described.

FIGS. 10 and 11 are each a side view of the positioning portion for explaining the operation thereof. The operation of the positioning portion will be described with reference to FIGS. 8, 9, and the like described above in addition to FIGS. 10 and 11.

Figure 10A:
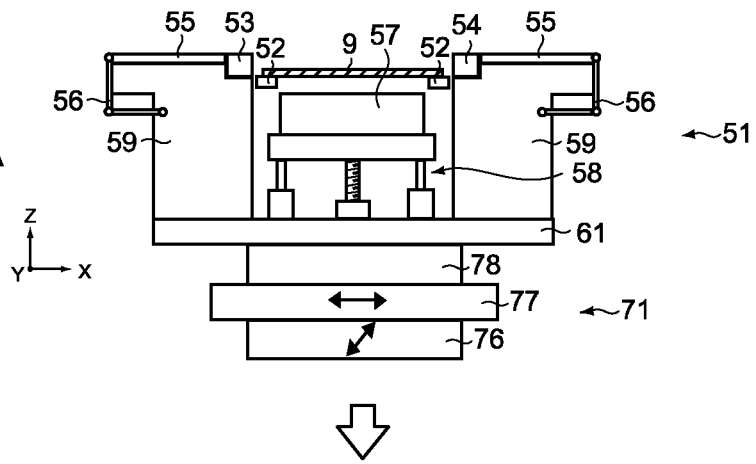
FIG. 10 are each a side view of the positioning portion for explaining an operation of the positioning portion.

As shown in FIG. 10A, the substrate holding mechanism 51 of the positioning portion 50 moves in the y- and x-axis directions by the movements of the y-axis table 76 and the x-axis table 77 of the moving mechanism 71. Accordingly, the positioning portion 50 is moved toward the carry-in conveyor 98 on the upstream side of the conveyor belts 52 (see FIG. 8).

The substrate holding mechanism 51 receives the unprocessed print substrate 9 carried in by the carry-in conveyor 98 from outside the screen printing apparatus 100 using the conveyor belts 52. When the print substrate 9 is moved to the conveyor belts 52, the substrate holding mechanism 51 is again moved in the y- and x-axis directions by the movements of the y-axis table 76 and the x-axis table 77 and thus returns to a predetermined position in the screen printing apparatus 100. While the substrate holding mechanism 51 returns to the predetermined position, the print substrate 9 is conveyed to a predetermined position on the suction block 57 by the driving of the conveyor belts 52.

Figure 10B:
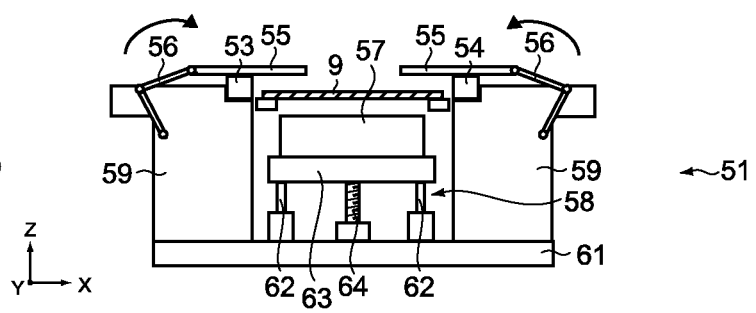

When the print substrate 9 is conveyed to the position above the suction block 57, the arms 56 are driven and the substrate correction clamps 55 are moved to predetermined positions as shown in FIG. 10B. In other words, the substrate correction clamps 55 are moved from the standby position to the operating position. At this time, the substrate correction clamps 55 are moved so that lower surfaces thereof come into contact with the upper surfaces of the substrate clamps 53 and 54. Moreover, the substrate correction clamps 55 are moved so that they extend more on the inner side than the substrate clamps 53 and 54 and a part of the substrate correction clamps 55 is positioned above the print substrate 9.

Figure 10C:
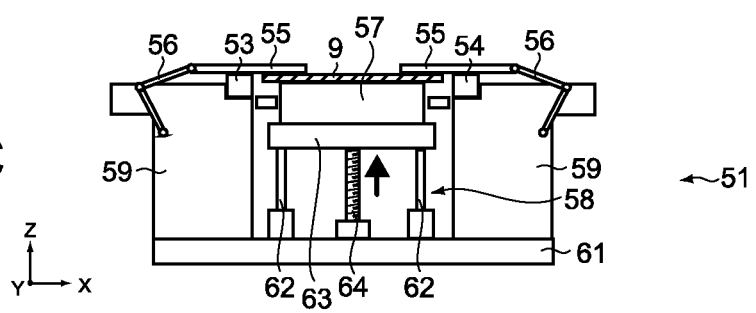

When the substrate correction clamps 55 are moved to the operating position, the lifting table 63 is lifted along the z-axis guides 62 by the rotation of the ball screw 64 as shown in FIG. 10C, with the result that the suction block 57 mounted on the lifting table 63 rises. By the rise of the suction block 57, the print substrate 9 conveyed to the position above the suction block 57 is lifted by the upper surface of the suction block 57 to be raised from the conveyor belts 52.

The suction block 57 is raised to a position at which the upper surface of the print substrate 9 comes into contact with the lower surfaces of the substrate correction clamps 55. The substrate correction clamps 55 downwardly press the print substrate 9 lifted by the upper surface of the suction block 57 at both ends of the print substrate 9 in the width direction (x-axis direction).

Next, the vacuum pump (not shown) coupled to the suction block 57 is driven, and the suction block 57 sticks to and holds the print substrate 9 via the suction holes provided on the upper surface thereof. Accordingly, a warpage and deflection of the print substrate 9 are corrected.

Figure 10D:
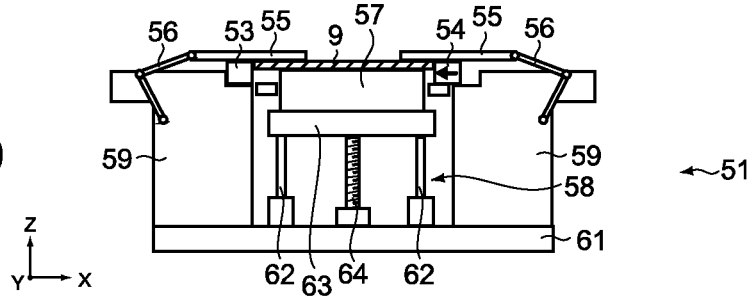

When the warpage and deflection of the print substrate 9 are corrected, the movable clamp 54 is moved toward the fixed clamp 53 and the print substrate 9 is clamped by the fixed clamp 53 and the movable clamp 54 as shown in FIG. 10D.

Figure 11A:
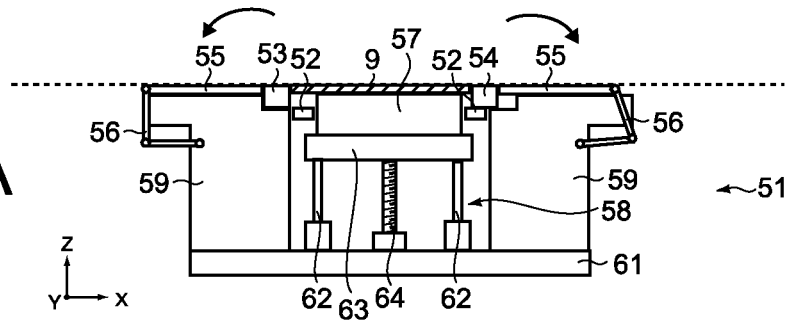
FIG. 11 are each a side view of the positioning portion for explaining an operation of the positioning portion.
Figure 11B:
Figure 11B:
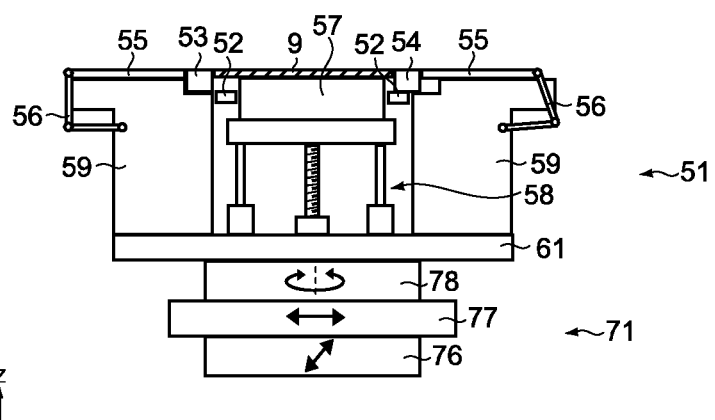
Figure 11C:
Figure 11C:
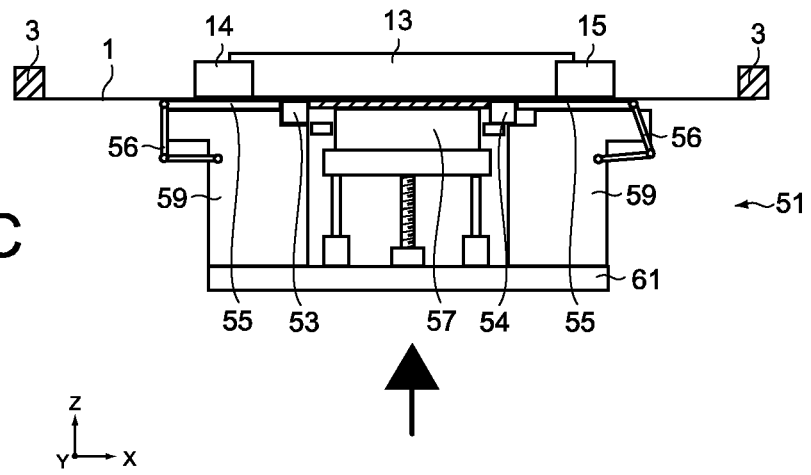

When the print substrate 9 is clamped, the substrate correction clamps 55 return to the standby position from the operating position by the driving of the arms 56 as shown in FIG. 11E. Here, of the two substrate correction clamps 55, the substrate correction clamp 55 on the outer side of the movable clamp 54 in the width direction (right-hand side of FIG. 11E) returns to a position at which it comes into contact with the outer end portion of the movable clamp 54. Specifically, the substrate correction clamp 55 provided on the right-hand side of FIG. 11 returns to the position at which it comes into contact with the outer end portion of the movable clamp 54 without a gap being formed between the substrate correction clamp 55 and the movable clamp 54 moved toward the fixed clamp 53.

In a state where the substrate correction clamps 55 have returned to the standby position, the upper surface of the print substrate 9, the upper surfaces of the substrate clamps 53 and 54, and the upper surfaces of the substrate correction clamps 55 are on substantially the same plane (see broken line).

When the substrate correction clamps 55 have returned to the standby position, the image recognition camera 86 moves above the print substrate 9 to recognize the alignment mark formed on the print substrate 9 (see FIG. 8).

When the alignment mark is recognized, the y-axis table 76, the x-axis table 77, and the θ-axis table 78 move in the y-, x-, and θ-axis directions as shown in FIG. 11F based on positional information of the alignment mark. Accordingly, the position of the print substrate 9 is corrected.

When the position of the print substrate 9 is corrected, the rod 75b of the air cylinder 75 provided below the z-axis table 74 is driven so that the z-axis table 74 is lifted along the z-axis guides 73 (see FIGS. 8 and 9). Accordingly, as shown in FIG. 11G, the substrate holding mechanism 51 is moved upwardly. The z-axis table 74 is lifted by the rod 75b until it comes into contact with the stoppers 79 provided to the z-axis guides 73. When the z-axis table 74 comes into contact with the stoppers 79, the upper surface of the print substrate 9, the upper surfaces of the substrate clamps 53 and 54, and the upper surfaces of the substrate correction clamps 55 come into contact with the lower surface of the screen 1.

At this time, since the upper surface of the print substrate 9, the upper surfaces of the substrate clamps 53 and 54, and the upper surfaces of the substrate correction clamps 55 are on substantially the same plane as described above, the screen 1 can be supported horizontally from below. In addition, since the substrate clamps 53 and 54 and the substrate correction clamps 55 are firmly supported by the clamp support members 59 from below, the screen 1 can be firmly supported from below.

Figure 12:
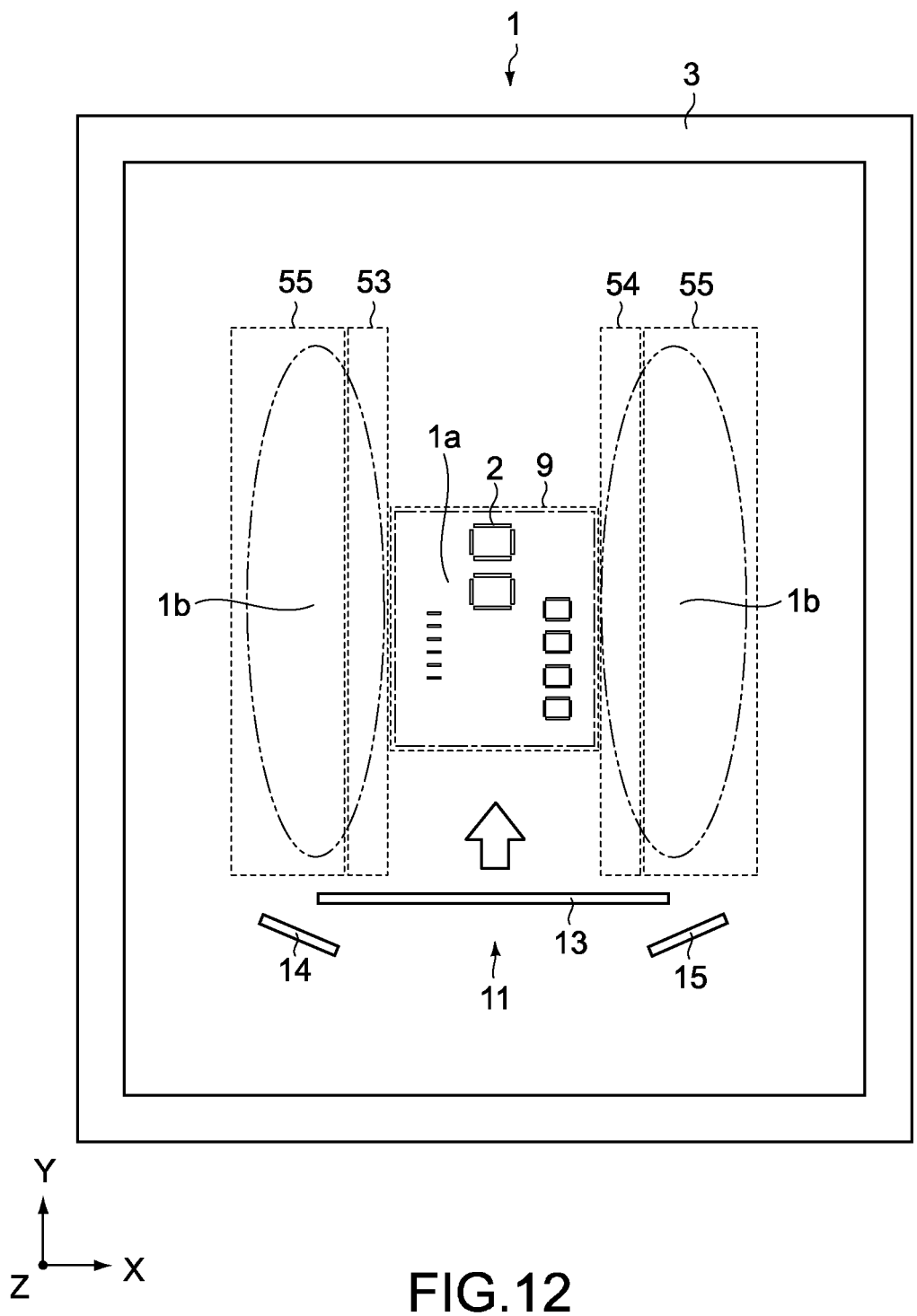
FIG. 12 is a skeleton diagram of a screen seen from above, that shows a state where an upper surface of a print substrate, upper surfaces of substrate clamps, and upper surfaces of substrate correction clamps are in contact with a lower surface of the screen.

FIG. 12 is a skeleton diagram of the screen 1 seen from above, that shows a state where the upper surface of the print substrate 9, the upper surfaces of the substrate clamps 53 and 54, and the upper surfaces of the substrate correction clamps 55 are in contact with the lower surface of the screen 1.

As shown in FIG. 12, the print substrate 9 comes into contact with the lower surface of the screen 1 at a position below the pattern-hole forming area 1a where the pattern holes 2 are formed. Since the print substrate 9 is accurately positioned by the positioning portion 50 as described above, positions of the wiring patterns of the print substrate 9 accurately coincide with positions of the pattern holes 2 formed in the pattern-hole forming area 1a. It should be noted that at this time, the print substrate 9 is supported by the suction block 57 from below.

The substrate clamps 53 and 54 and the substrate correction clamps 55 are brought into contact with the lower surface of the screen 1 and support the screen 1 from below at positions below side areas 1b as areas on both sides of the pattern-hole forming area 1a in the width direction (x-axis direction). In this case, since the upper surfaces of the substrate clamps 53 and 54 and the upper surfaces of the substrate correction clamps 55 are on substantially the same plane as the upper surface of the print substrate 9 as described above, the screen 1 can be supported horizontally from below.

By the squeegee portion 10 sliding on the screen 1 in this state, the cream solder 4 is printed on the print substrate 9. It should be noted that an operation of the squeegee portion 10 will be described later in detail.

When the cream solder 4 is printed on the print substrate 9, the rod 75b of the air cylinder 75 provided below the z-axis table 74 is driven so that the z-axis table 74 is lowered (see FIGS. 8 and 9). Accordingly, the substrate holding mechanism 51 is lowered.

When the substrate holding mechanism 51 is lowered, the print substrate 9 is released from the clamp by the substrate clamps 53 and 54. When the clamped state is released, the suction block 57 is lowered by the lifting portion 58. At this time, the print substrate 9 is moved from the position above the suction block 57 to the position above the conveyor belts 52.

Next, the substrate holding mechanism 51 is moved in the y- and x-axis directions by the movements of the y-axis table 76 and the x-axis table 77 and moved toward the discharge conveyor 99 disposed on the downstream side of the conveyor belts 52 (see FIG. 8). Then, the conveyor belts 52 are driven so that the processed print substrate 9 is handed over to the discharge conveyor 99. The processed print substrate 9 is taken out of the screen printing apparatus 100 by the discharge conveyor 99.

When the processed print substrate 9 is handed over to the discharge conveyor 99, the substrate holding mechanism 51 is again moved toward the carry-in conveyor 98 to receive an unprocessed print substrate 9 from the carry-in conveyor 98. Then, the cream solder 4 is again printed on the print substrate 9.

(Operation of Squeegee Portion)

Next, an operation of the squeegee portion 10 will be described.

Figure 14A:
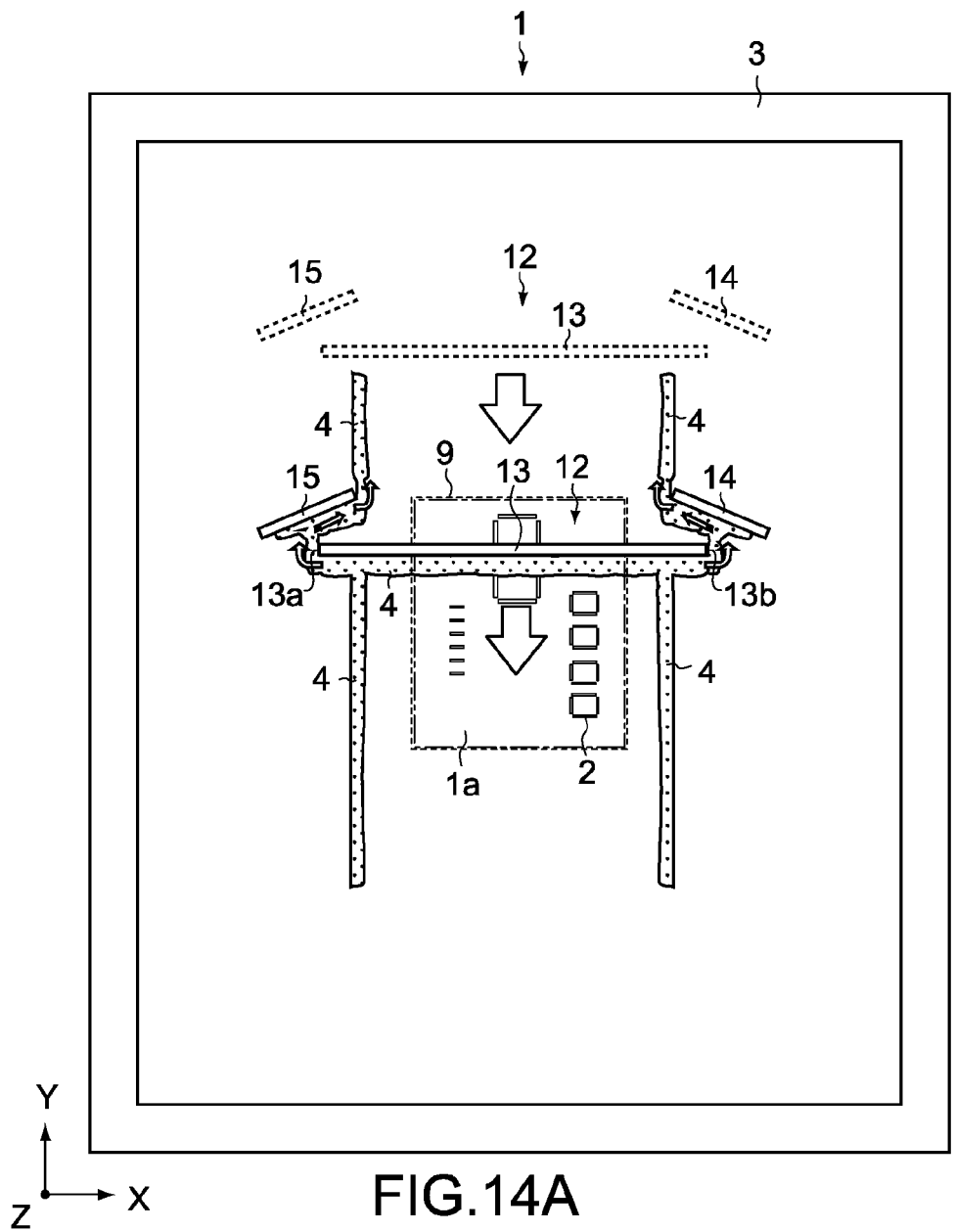
FIG. 14 are a top view and a side view of the squeegee portion and the screen for explaining an operation of the squeegee portion.
Figure 14B:
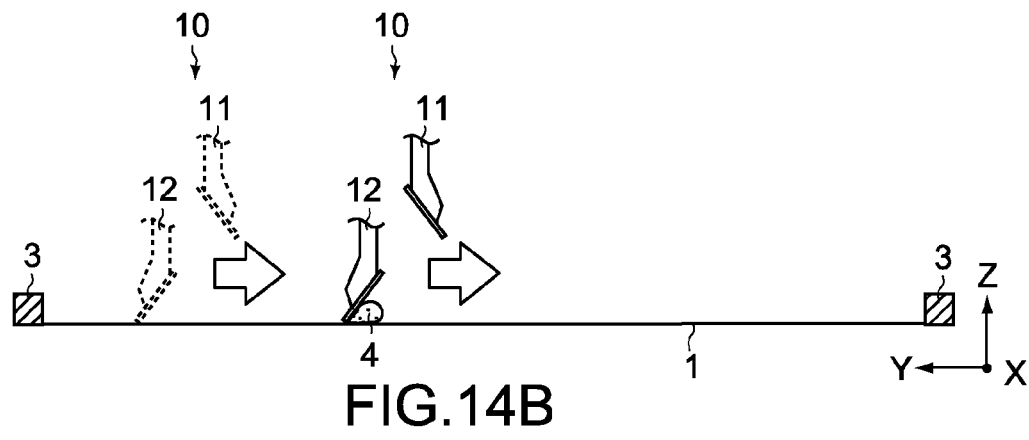

FIGS. 13 and 14 are diagrams for explaining the operation of the squeegee portion 10. FIGS. 13A and 14A are top views of the squeegee portion 10 and the screen 1, and FIGS. 13B and 14B are side views of the squeegee portion 10 and the screen 1. It should be noted that FIGS. 13A and 14A schematically show the tip end portions of the main squeegee 13 and the auxiliary squeegees 14 and 15.

First, in a state where the squeegee portion 10 is positioned above an area in the vicinity of the end portion of the screen 1 as indicated by the broken lines of FIG. 13, the air cylinder 41 of the first squeegee mechanism 11 is driven so that the first squeegee mechanism 11 is lowered. When the first squeegee mechanism 11 is lowered, the tip end portions of the main squeegee 13 and the auxiliary squeegees 14 and 15 (edge portions 133) come into contact with the screen 1 with a predetermined pressure.

Before or after the first squeegee mechanism 11 is lowered, the cream solder 4 is supplied to the screen 1 from a supply portion (not shown). In this case, the cream solder 4 is supplied to the front side of the sliding direction of the first squeegee mechanism 11.

Next, the first squeegee mechanism 11 is started to be moved toward the center of the screen 1 (see solid lines). When the movement of the first squeegee mechanism 11 is started, the main squeegee 13 slides on the screen 1, and the cream solder 4 moves on the screen 1 while being rolled on the front side of the sliding direction of the main squeegee 13.

At this time, the cream solder 4 that has leaked from the sides of the end portions 13a and 13b of the main squeegee 13 returns to the area that is more on the inner side than the width of the main squeegee 13 as well as on the inner side of the screen 1 by the auxiliary squeegees 14 and 15. The auxiliary squeegees 14 and 15 are capable of not only causing the cream solder 4 to return to the area on the inner side of the screen 1, but also causing the cream solder 4 to return to the area on the inner side of the screen 1 while rolling and kneading the cream solder 4.

When the main squeegee 13 reaches the pattern-hole forming area 1a of the screen 1, the cream solder 4 is printed on the print substrate 9 that is in contact with the lower surface of the screen 1 via the pattern holes 2.

When the first squeegee mechanism 11 reaches the area in the vicinity of the end portion of the screen 1 on the other side, the movement of the squeegee portion 10 in the y-axis direction stops.

When the movement of the squeegee portion 10 in the y-axis direction is stopped, the first squeegee mechanism 11 is lifted upwardly by the air cylinder 41 and the second squeegee mechanism 12 is lowered by the air cylinder 41 as indicated by the broken lines of FIG. 14. When the second squeegee mechanism 12 is lowered, the main squeegee 13 and the auxiliary squeegees 14 and 15 of the second squeegee mechanism 12 are brought into contact with the upper surface of the screen 1 with a predetermined pressure.

Next, the second squeegee mechanism 12 slides in a direction opposite to the sliding direction of the first squeegee mechanism 11. The second squeegee mechanism 12 prints the cream solder 4 on the print substrate 9 using the main squeegee 13 and causes the cream solder 4 that has leaked from the sides of the end portions 13a and 13b of the main squeegee 13 in the width direction (x-axis direction) to return to the inner side of the screen 1 using the auxiliary squeegees 14 and 15.

At this time, the cream solder 4 that has leaked from the sides of the main squeegee 13 of the first squeegee mechanism 11 and been caused to return to the inner side of the screen 1 by the auxiliary squeegees 14 and 15 is mixed with the cream solder 4 on the front side of the main squeegee 13 of the second squeegee mechanism 12 and retrieved. The cream solder 4 retrieved by the main squeegee 13 is again rolled and kneaded by the main squeegee 13.

When the second squeegee mechanism 12 reaches the area in the vicinity of the end portion of the screen 1, the movement of the squeegee portion 10 in the y-axis direction stops. At this time, the second squeegee mechanism 12 is lifted upwardly and the first squeegee mechanism 11 is lowered.

Then, the first squeegee mechanism 11 again slides on the screen 1 while causing the cream solder 4 to roll. At this time, the cream solder 4 that has returned to the inner side of the screen 1 by the auxiliary squeegees 14 and 15 of the second squeegee mechanism 12 is mixed with the cream solder 4 on the front side of the main squeegee 13 of the first squeegee mechanism 11 and retrieved.

As described above, in this embodiment, the cream solder 4 that has leaked from the sides of the main squeegee 13 of one of the squeegee mechanisms can be caused to return to the inner side of the screen 1 by the auxiliary squeegees 14 and 15 and mixed with the cream solder 4 on the front side of the main squeegee 13 of the other one of the squeegee mechanisms to be retrieved. In other words, the cream solder 4 that has leaked from the sides of the end portions 13a and 13b of the main squeegee 13 can be recycled.

Accordingly, the amount of cream solder 4 that is leaked from the sides of the end portions 13a and 13b of the main squeegee 13 and cannot help but be discarded due to desiccation, a chemical change, and the like can be reduced. As a result, costs can be cut and environmental problems can be remedied. Moreover, labor hours required for the workers to retrieve the cream solder 4 can also be cut.

Further, since consecutive print processes are possible in this embodiment, a productivity can be improved.

Furthermore, as described above, the auxiliary squeegees 14 and 15 are capable of not only causing the cream solder 4 to merely return to the area on the inner side of the screen 1, but also causing the cream solder 4 to return to the area on the inner side of the screen 1 while rolling and kneading the cream solder 4. Consequently, it is possible to prevent the cream solder 4 that has returned to the area on the inner side of the screen 1 from drying or undergoing a chemical change. As a result, it is possible to prevent the cream solder 4 that has dried from being mixed with the cream solder 4 on the front side of the main squeegee 13 and printed on the print substrate 9 to thus lower the quality of the print substrate 9, for example.

Incidentally, when the first squeegee mechanism 11 and the second squeegee mechanism 12 slide on the screen 1, the substrate clamps 53 and 54 and the substrate correction clamps 55 are horizontally supporting the lower surface of the screen 1 from below the screen 1 (see FIGS. 11G and 12). At this time, the substrate clamps 53 and 54 and the substrate correction clamps 55 are horizontally supporting the lower surface of the screen 1 at positions below the side areas 1b of the screen 1. Moreover, at this time, the substrate clamps 53 and 54 and the substrate correction clamps 55 are firmly supported from below by the clamp support members 59.

With this structure, it is possible to prevent a gap from being caused between the screen 1 and the squeegees 13 to 15 in the side areas 1b on the screen 1. In other words, adhesiveness between the screen 1 and the tip end portions of the squeegees 13 to 15 in the side areas 1b can be enhanced.

Here, in a case where a gap is caused between the screen 1 and the squeegees 13 to 15, the cream solder 4 remains on the screen 1 as a thin film. Since the cream solder 4 that has remained on the screen 1 as a thin film has a large surface area that is exposed to outside air, desiccation, a chemical change, and the like are prominent. The cream solder 4 often remains as a thin film particularly in a case where the side areas 1b of the screen 1 have a weak backup.

In this regard, in this embodiment, lower surfaces of the side areas 1b of the screen 1 are horizontally supported by the substrate clamps 53 and 54 and the substrate correction clamps 55. Accordingly, since the adhesiveness between the screen 1 and the squeegees 13 to 15 can be enhanced, the cream solder 4 can be prevented from remaining on the screen 1 as a thin film in the side areas 1b of the screen 1. As a result, the amount of cream solder 4 to be discarded can be additionally reduced.

Further, in this embodiment, the squeegee holding member 16 that holds the main squeegee 13 is rotatably attached to the coupling bracket 21 with the axis in the y-axis direction as a center axis as described above (see FIG. 5). With this structure, an entire balance can be taken so that the tip end portions of the squeegees 13 to 15 are brought into contact with the upper surface of the screen 1 with a uniform force at the time the squeegees 13 to 15 slide above the screen 1. Accordingly, the adhesiveness between the screen 1 and the tip end portions of the squeegees 13 to 15 can be enhanced, with the result that an effect of preventing a thin film from being generated on the screen 1 as a remain becomes larger.

Furthermore, as described above, the tip end portions of the squeegees 13 to 15 have sharp edge portions 133, and the groove 131 is formed on each of the back surfaces of the squeegees 13 to 15 in the sliding direction (see FIG. 7). Since a flexibility of the squeegees 13 to 15 can be enhanced by the grooves 131, the adhesiveness of the tip end portions (edge portions 133) of the squeegees 13 to 15 with respect to the screen 1 can be additionally enhanced. As a result, the effect of preventing a thin film from being generated on the screen 1 as a remain becomes larger.

As described above, since countermeasures with respect to the side leak of the cream solder 4 and a thin film as a remain are taken in the screen printing apparatus 100 of this embodiment, the amount of cream solder 4 to be discarded can be reduced to the utmost limit. Accordingly, cost cut, suppression of environmental deterioration, cut of labor hour of workers, and the like can be additionally promoted.

(Values of Skew Angle θ and Protrusion Length l)

Next, referring back to FIG. 6, values of the skew angle θ and the protrusion length l will be described.

As described above, this embodiment aims at causing the cream solder 4 that has leaked from the sides of the main squeegee 13 to return to the inner side of the screen 1 by the auxiliary squeegees 14 and 15 and recycling the cream solder 4 to thus reduce the amount of cream solder 4 to be discarded. Therefore, the values of the skew angle θ and the protrusion length l are set so that the cream solder 4 that has leaked from the sides of the end portions 13a and 13b of the main squeegee 13 is appropriately gathered in the area on the inner side of the screen 1.

Figures 15A, 15B:
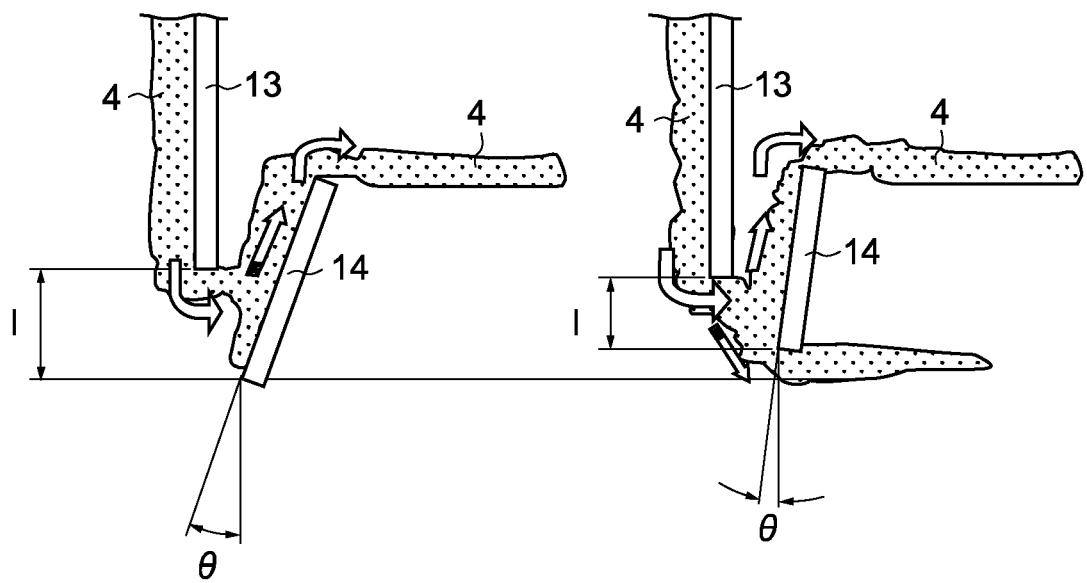
FIG. 15 are comparative diagrams for explaining values of a skew angle $\theta$ and a protrusion length l.

FIG. 15 are comparative diagrams for explaining the values of the skew angle θ and the protrusion length l. FIG. 15A is a top view showing a flow of the cream solder 4 in a case where the skew angle θ and the protrusion length l are set to appropriate values, whereas FIG. 15B is a top view showing a flow of the cream solder 4 in a case where the skew angle θ and the protrusion length l are set to inappropriate values.

As shown in FIG. 15B, when the skew angle θ is as small as, for example, 5 degrees, depending on a velocity of the squeegee portion 10 (e.g., 50 mm/s), the cream solder 4 flows out from the auxiliary squeegee 14 (or auxiliary squeegee 15; the same holds true for descriptions below). Therefore, the skew angle θ is typically set to be 15 degrees or more. It should be noted that when the skew angle θ is as large as, for example, 30 degrees, a distance of a back-and-forth movement of the squeegee portion 10 becomes large, and a sliding distance of the squeegee portion 10 is thus restricted.

In this regard, the skew angle θ is typically set to be 15 degrees or more and 25 degrees or less (FIG. 15A).

Further, when the protrusion length l is short as shown in FIG. 15B, the cream solder 4 flows out from the auxiliary squeegee 14. Whether the cream solder 4 flows out from the auxiliary squeegee 14 is related to a movement velocity of the squeegee portion 10, a rolling diameter of the cream solder 4 rolled on the front side of the main squeegee 13, and the like. For example, when the protrusion length l is 10 mm, the cream solder 4 flows out from the auxiliary squeegee 14. In this regard, the protrusion length l is typically set to be 15 mm or more. It should be noted that if the protrusion length l is too long, the width of the squeegee portion 10 becomes large, or the too long a protrusion length l may function as a brake. Therefore, the protrusion length l is typically set to be 15 mm or more and 20 mm or less (FIG. 15A).

By setting the skew angle θ to be 15 degrees or more and 25 degrees or less and setting the protrusion length l to be 15 mm or more and 20 mm or less, the cream solder 4 that has leaked from the sides of the main squeegee 13 can be appropriately gathered in the area on the inner side of the screen 1 as shown in FIG. 15A.

<Second Embodiment>

Next, a screen printing apparatus according to a second embodiment of the present invention will be described. The screen printing apparatus of the second embodiment has a squeegee mechanism having a different structure from that of the first embodiment. Thus, the structure of the squeegee mechanism will mainly be described. It should be noted that in the second embodiment, structures and functions that are the same as those of the first embodiment above are denoted by the same symbols, and descriptions thereof will be omitted or simplified.

Figure 16:
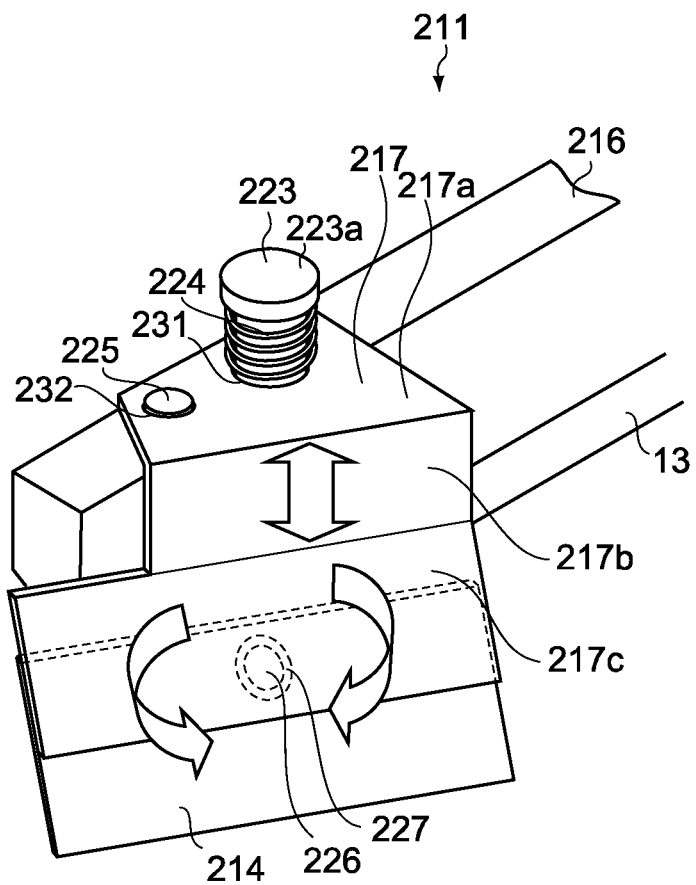
FIG. 16 is a perspective view showing a part of a squeegee mechanism of a screen printing apparatus according to another embodiment of the present invention.

FIG. 16 is a perspective view showing a part of the squeegee mechanism of the screen printing apparatus of the second embodiment. It should be noted that in FIG. 16, a structure of one auxiliary squeegee, auxiliary-squeegee holding member, and the like that are provided two each in the squeegee mechanism will be described as a representative.

As shown in FIG. 16, a squeegee mechanism 211 of this embodiment includes the main squeegee 13, a squeegee holding member 216 that holds the main squeegee 13, an auxiliary squeegee 214, and an auxiliary-squeegee holding member 217 that holds the auxiliary squeegee 214. The squeegee mechanism 211 also includes a shaft 226 and a bearing 227 for rotating the auxiliary squeegee 214 with respect to the auxiliary-squeegee holding member 217. Further, the squeegee mechanism 211 includes a spring 224 for vertically moving the auxiliary-squeegee holding member 217 with respect to the squeegee holding member 216, a spring support member 223 that supports the spring 224, and a pin 225 that restricts the rotation of the auxiliary-squeegee holding member 217 about the z axis.

The auxiliary-squeegee holding member 217 is provided in the vicinity of an end portion of the squeegee holding member 216 in the width direction (x-axis direction). The auxiliary-squeegee holding member 217 is formed by bending a single board by press work, for example.

An upper portion 217a of the auxiliary-squeegee holding member 217 is formed to be parallel to the horizontal plane (x-y plane), and an intermediate portion 217b of the auxiliary-squeegee holding member 217 is formed to be vertical to the horizontal plane. Further, a lower portion 217c of the auxiliary-squeegee holding member 217 is formed to tilt a predetermined angle with respect to the horizontal plane. It should be noted that the intermediate portion 217b and the lower portion 217c of the auxiliary-squeegee holding member 217 are formed to tilt an angle corresponding to the skew angle $\theta$ with respect to the x-z plane. In descriptions below, the upper portion 217a of the auxiliary-squeegee holding member 217 will be referred to as horizontal portion 217a, the intermediate portion 217b of the auxiliary-squeegee holding member 217 will be referred to as vertical portion 217b, and the lower portion 217c of the auxiliary-squeegee holding member 217 will be referred to as tilted portion 217c.

Formed on the horizontal portion 217a of the auxiliary-squeegee holding member 217 are a penetrating opening 231 into which the spring support member 223 is inserted and a penetrating opening 232 into which the pin 225 is inserted. In other words, two penetrating openings 231 and 232 are formed on the horizontal portion 217a.

On an upper surface of the squeegee holding member 216, two screw holes (not shown) are formed in association with the two penetrating openings 231 and 232 formed on the horizontal portion 217a.

The spring support member 223 includes a stopper 223a at an upper portion thereof and a screw portion (not shown) at a lower portion thereof. The stopper 223a supports the spring 224 from above as well as prevent the spring 224 from slipping out of the spring support member 223.

The spring support member 223 is inserted into the penetrating opening 231 formed on the horizontal portion 217a and screwed to the screw hole formed on the upper surface of the squeegee holding member 216. With this structure, the spring support member 223 is fixed to the squeegee holding member 216.

The spring 224 presses the upper surface of the horizontal portion 217a of the auxiliary-squeegee holding member 217 from above to press the auxiliary-squeegee holding member 217 toward the screen 1. Accordingly, the auxiliary squeegee 214 is brought into contact with the screen 1 with a predetermined pressure. It should be noted that a spring pressure of the spring 224 will be described later in detail.

Since the auxiliary-squeegee holding member 217 is attached to the squeegee holding member 216 via the spring support member 223 and the spring 224 in this embodiment, the auxiliary-squeegee holding member 217 can be moved vertically with respect to the squeegee holding member 216.

The pin 225 is inserted into the penetrating opening 232 formed on the horizontal portion 217a and screwed to the screw hole formed on the upper surface of the squeegee holding member 216. With this structure, the pin 225 is fixed to the squeegee holding member 216. By the pin 225, the auxiliary-squeegee holding member 217 can be prevented from rotating about the z axis.

The auxiliary squeegee 214 is provided on the back side of the tilted portion 217c of the auxiliary-squeegee holding member 217. The auxiliary squeegee 214 is attached on the back side of the tilted portion 217c via the shaft 226 and the bearing 227. With this structure, the auxiliary squeegee 214 is rotatably held by the auxiliary-squeegee holding member 217.

While being held by the auxiliary-squeegee holding member 217, the auxiliary squeegee 214 is tilted a tilt angle $\phi$ with respect to the horizontal plane (x-y plane) and tilted a skew angle $\theta$ with respect to the x-z plane (with respect to main squeegee 13). The values of the tilt angle $\phi$, the skew angle $\theta$, and the like are the same as those of the first embodiment above.

In the squeegee mechanism 211 of the second embodiment, the auxiliary squeegee 214 is vertically movable. Further, the auxiliary squeegee 214 is rotatably held by the auxiliary-squeegee holding member 217. Accordingly, adhesiveness of the auxiliary squeegee 214 with respect to the screen 1 can be additionally enhanced. Thus, it is possible to prevent a gap from being caused between the auxiliary squeegee 214 and the screen 1 and the cream solder 4 from remaining on the screen 1 as a thin film. As a result, an amount of cream solder 4 to be discarded can be additionally reduced, thus leading to an additional promotion of cost cut, a suppression of environmental deterioration, cut of labor hours of workers, and the like.

Next, the spring pressure of the spring 224 will be described.

The spring pressure of the spring 224 is set to be weaker than a printing pressure of the main squeegee 13. This is because, if the spring pressure of the spring 224 is too large, the printing pressure of the main squeegee 13 becomes smaller than the spring pressure to thus cause the main squeegee 13 to float. If the main squeegee 13 floats, a gap is caused between the main squeegee 13 and the screen 1 and the cream solder 4 remains on the screen 1 as a thin film to thus lower a printing quality. In this regard, the spring pressure of the spring 224 is typically set to be weaker than the printing pressure of the main squeegee 13. Accordingly, it is possible to prevent the cream solder 4 from remaining on the screen 1 as a thin film or a printing quality from being lowered.

<Modified Examples>

The present invention is not limited to the above embodiments, and various modifications can be made without departing from the gist of the present invention.

In the descriptions on FIG. 7, the grooves 131 formed in the vicinity of the tip end portions of the squeegees 13 to 15 have been formed on the back surfaces of the squeegees 13 to 15 in the sliding direction. However, the present invention is not limited thereto, and the grooves 131 may be formed on the front surfaces of the squeegees 13 to 15 in the sliding direction.

Alternatively, the squeegees 13 to 15 may be used while front and back surfaces thereof in the sliding direction are inverted with respect to the holding members 16 to 18. In this case, the front and back surfaces of the squeegees 13 to 15 are inverted when one of the two edge portions 133 (see FIG. 7B) is worn down due to friction with the screen 1.

In the above descriptions, out of the two substrate clamps 53 and 54, the substrate clamp 53 has been fixed and the substrate clamp 54 has been movable in the width direction (x-axis direction). However, the present invention is not limited thereto, and both of the substrate clamps 53 and 54 may be movable in the width direction. In this case, by both of the substrate clamps 53 and 54 moving close to each other, the print substrate 9 is clamped. It should be noted that in this case, at a time the two substrate correction clamps 55 are caused to return to the standby position from the operating position (see FIG. 11E), both of the substrate correction clamps 55 may be caused to return to the standby position such that a gap is not caused between the substrate correction clamps 55 and the moved substrate clamps 53 and 54.

In the second embodiment above, other elastic bodies such as rubber may be used in place of the spring 224. In this case, an elastic force of the elastic body is typically set to be weaker than the printing pressure of the main squeegee 13.

The present application contains subject matter related to that disclosed in Japanese Priority Patent Application JP 2009-084653 filed in the Japan Patent Office on Mar. 31, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A screen printing apparatus, comprising:
   a main squeegee that includes a pair of end portions in a width direction thereof and that prints, by sliding in a direction orthogonal to the width direction on an upper surface of a screen that is supplied with a paste-like material and that includes a hole, the paste-like material being provided onto an upper surface of a printing object via the hole in the screen when the screen is positioned over the printing object; and
   a pair of auxiliary squeegees each including a first end portion and a second end portion and each corresponding to one end portion of the main squeegee, wherein,
      at least the main squeegee includes a tip end portion having (i) a plurality of curved grooves formed therein along the width direction of the main squeegee and (ii) at least a first edge portion that comes into contact with the upper surface of the screen and is adjoined by one of the plurality of curved grooves, the main squeegee being tilted with respect to the upper surface of the screen such that the first edge portion adjoined by one of the plurality of curved grooves comes into contact with the upper surface of the screen at a first tilt angle other than a zero angle,
      the main squeegee further includes a second portion, other than the tip end portion, that does not come into contact with the upper surface of the screen and has a single rectangular groove formed therein along the width direction of the main squeegee,
      each end portion of the main squeegee is between the first and second end portions of the corresponding auxiliary squeegee in the width direction, and
      the pair of auxiliary squeegees are tilted with respect to the main squeegee at a second tilt angle other than the zero angle.

2. The screen printing apparatus according to claim 1, further comprising:
   a main-squeegee holding member to hold the main squeegee; and
   a pair of auxiliary-squeegee holding members that are movable in a vertical direction with respect to the main-squeegee holding member and hold the pair of auxiliary squeegees.

3. The screen printing apparatus according to claim 2, wherein the pair of auxiliary-squeegee holding members rotatably hold the pair of auxiliary squeegees.

4. The screen printing apparatus according to claim 3, further comprising a pair of elastic bodies interposed between the main-squeegee holding member and the pair of auxiliary-squeegee holding members.

5. The screen printing apparatus according to claim 1, further comprising a holding mechanism that holds the printing object and horizontally supports, from below, an area of the screen on which one of the main squeegee and the pair of auxiliary squeegees slide during screen printing.

6. The screen printing apparatus according to claim 5, wherein the holding mechanism includes
   a pair of clamp members that clamp the printing object, each of the pair of clamp members including an upper surface that supports the area from below within substantially the same plane as the upper surface of the printing object during the screen printing, and
   a pair of correction members that correct a deflection of the printing object, each of the pair of correction members including an upper surface that supports the area from below within substantially the same plane as the upper surface of the printing object and the upper surfaces of the pair of clamp members during the screen printing.

7. The screen printing apparatus of claim 1, wherein a bottom of the single rectangular groove has a thickness that is about half of a thickness of the main squeegee.

8. A squeegee mechanism, comprising:
   a main squeegee that includes a pair of end portions in a width direction thereof and that prints, by sliding in a direction orthogonal to the width direction on an upper surface of a screen that is supplied with a paste-like material and that includes a hole, the paste-like material being provided onto an upper surface of a printing object via the hole in the screen when the screen is positioned over the printing object; and
   a pair of auxiliary squeegees each including a first end portion and a second end portion and each corresponding to one end portion of the main squeegee, wherein,
      at least the main squeegee includes a tip end portion having (i) a plurality of curved grooves formed therein along the width direction of the main squeegee and (ii) at least a first edge portion that comes into contact with the upper surface of the screen and is adjoined by one of the plurality of grooves, the main squeegee being tilted with respect to the upper surface of the screen such that the first edge portion adjoined by one of the plurality of curved grooves comes into contact with the upper surface of the screen at a first tilt angle other than a zero angle,
      the main squeegee further includes a second portion, other than the tip end portion, that does not come into contact with the upper surface of the screen and has a single rectangular groove formed therein along the width direction of the main squeegee, each end portion of the main squeegee is between the first and second end portions of the corresponding auxiliary squeegee in the width direction, and the pair of auxiliary squeegees are tilted with respect to the main squeegee at a second tilt angle other than the zero angle.

9. The squeegee mechanism of claim 8, wherein a bottom of the single rectangular groove has a thickness that is about half of a thickness of the main squeegee.

* * * * *